United States Patent
Maunder et al.

(10) Patent No.: US 12,418,312 B2
(45) Date of Patent: Sep. 16, 2025

(54) COMMUNICATION DEVICE WITH LOW DENSITY PARITY CHECK ROTATOR, AND METHOD THEREFOR

(71) Applicant: AccelerComm Limited, Southampton (GB)

(72) Inventors: Robert G. Maunder, Southampton (GB); Matthew Brejza, Southampton (GB)

(73) Assignee: AccelerComm Limited, Southampton (GB)

( * ) Notice: Subject to any disclaimer, the term of this patent is extended or adjusted under 35 U.S.C. 154(b) by 0 days.

(21) Appl. No.: 18/721,754

(22) PCT Filed: Dec. 20, 2022

(86) PCT No.: PCT/EP2022/087053
§ 371 (c)(1),
(2) Date: Jun. 19, 2024

(87) PCT Pub. No.: WO2023/118184
PCT Pub. Date: Jun. 29, 2023

(65) Prior Publication Data
US 2025/0062781 A1 Feb. 20, 2025

(30) Foreign Application Priority Data
Dec. 20, 2021 (GB) ...................... 2118548

(51) Int. Cl.
*H03M 13/11* (2006.01)
(52) U.S. Cl.
CPC ................ *H03M 13/116* (2013.01)
(58) Field of Classification Search
CPC .................................. H03M 13/116
See application file for complete search history.

(56) References Cited

U.S. PATENT DOCUMENTS 9,742,439 B1    8/2017  Graumann
10,838,811 B1 * 11/2020  Kuo ................. G06F 11/1012
(Continued)

FOREIGN PATENT DOCUMENTS

CN       112332856 A      2/2021

OTHER PUBLICATIONS

IEEE Transactions on Circuits and Systems—I: Regular Papers, Dec. 2020, vol. 67, No. 12, pp. 5454-5467, Petrovic et al, "Flexible High Throughput QC-LDPC Decoder with Perfect Pipeline Conflicts Resolution and Efficient Hardware Utilization". See e.g. the abstract.

(Continued)

*Primary Examiner* — Joseph D Torres
(74) *Attorney, Agent, or Firm* — Optimus Patents US, LLC

(57) ABSTRACT

A communication device comprises a low density parity check, LDPC, rotator circuit comprising sets of registers and configured to have a parallelism, P, of at least two, and to rotate a data sequence of Z data values by R positions, wherein ceil (Z/P) input blocks of P input values is accepted during a first subset of operations, which, before completion, ceil (Z/P) output blocks are provided during a second subset of operations. A padded input block is provided by mod (Z,P) of Z data values and P-mod (Z,P) of padding values when Z is not a multiple of P. The second register set is written with registered values derived before the second subset of operations begins and the values are not overwritten before the padded input block is accepted, and a P output value in an output block is a function of a registered value in the second register set.

20 Claims, 20 Drawing Sheets

(56) References Cited

U.S. PATENT DOCUMENTS

| | | | |
|---|---|---|---|
| 11,108,410 B1 | 8/2021 | Walke et al. | |
| 2011/0126078 A1* | 5/2011 | Ueng | H03M 13/6516 714/755 |
| 2017/0063400 A1* | 3/2017 | Zhang | H03M 13/1128 |
| 2023/0208440 A1* | 6/2023 | Maunder | H03M 13/6516 714/726 |

OTHER PUBLICATIONS

Electronics Letters, Apr. 5, 2018, vol. 54, No. 7, pp. 452-454, Kang et al, "Low-complexity, high-speed multi-size cyclic-shifter for quasi-cyclic LDPC decoder". See whole document.

IEEE Transactions on Circuits and Systems—II: Express Briefs, Oct. 2010, vol. 57, No. 10, pp. 782-786, Chen et al, "QSN—A Simple Circular-Shift Network for Reconfigurable Quasi-Cyclic LDPC Decoders". See e.g. the abstract.

Wang, Y.Anz.Hi [et al. ] : "A: highly compatible circular-shifting network for partially parallel QC-LDPC decoder", International Journal of Communications, Network and System Sciences, [Online] vol. 10, No. 05, Jan. 1, 2017 (Jan. 1, 2017), pp. 24-34, XP093023415, ISSN: 1913-3715• DOI: 10.4236/ijens.2017.105B003 Retrieved from the Internet: URL:https://www.scirp.org/journal/paperinformation.aspx?paperid=76530> [retrieved on Feb. 14, 2023] the whole document.

Xiioheng, Chen [et al.]: "QSN—a simple circular-shift network for reconfigurable quasi-cyclc LDPC decoders", IEEE Transactions on Circuits and Systems II: Express Briefs, vol. 57, No. 10, Oct. 1, 2010 (Oct. 1, 2010), pp. 782-786, XP011319242, ISSN: 1549-7747 the whole document.

Hailes, Peter [et al.]: "A flexible FPGA-based quasi-cyclic LDPC decoder", IEEE Access, vol. 5, 2017 pp. 20965-20984, XP011672085, DOI: 10.1109/ACCESS.2017.2678103 [retrieved on Oct. 24, 2017] the whole document.

* cited by examiner 401
a b c d $$\begin{bmatrix} 1 & 0 & 0 & 0 \\ 0 & 1 & 0 & 0 \\ 0 & 0 & 1 & 0 \\ 0 & 0 & 0 & 1 \end{bmatrix}\begin{matrix} a \\ b \\ c \\ d \end{matrix}$$

Z=4 rotation = 0

402
a b c d $$\begin{bmatrix} 0 & 1 & 0 & 0 \\ 0 & 0 & 1 & 0 \\ 0 & 0 & 0 & 1 \\ 1 & 0 & 0 & 0 \end{bmatrix}\begin{matrix} b \\ c \\ d \\ a \end{matrix}$$

Z=4 rotation = 1

402
a b c d $$\begin{bmatrix} 0 & 0 & 1 & 1 \\ 1 & 0 & 0 & 0 \\ 0 & 1 & 0 & 0 \\ 0 & 0 & 0 & 0 \end{bmatrix}\begin{matrix} d \\ a \\ b \\ c \end{matrix}$$

Z=4 rotation = 3

401
a b c d e $$\begin{bmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{bmatrix}\begin{matrix} a \\ b \\ c \\ d \\ e \end{matrix}$$

Z=5 rotation = 0

402
a b c d e ⎫ natural ordering 403

$$\begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 10 \end{bmatrix}\begin{matrix} c \\ d \\ e \\ a \\ b \end{matrix}$$ ⎬ rotated ordering 404

Z=5 rotation = 2 natural ordering 403

UR[0:4] = [0.4, -3.2, 2.1, 1.8, 3.5]  Z=5 rotation = 0                 rotated ordering 404
[0.4, -3.2, 2.1, 1.8, 3.5]

rotated ordering 404 rotation = 2
[2.1, 1.8, 3.5, 0.4, -3.2]

|  |  | WARMUP 1 | WARMUP 2 |  |  |  |  |  |
|---|---|---|---|---|---|---|---|---|
| 1211 | | 1101 | 1102 | | | 1411, 1105 | | 1202 |
| | 1309 block index | 4 | 0 (1401) | 1 | 2 | 3 | 0 | 1 |
| BC 0 1310 | block in | 16 17 (x x) | 0 1 2 3 | 4 5 6 7 | 8 9 10 11 | 12 13 14 15 | 0 1 2 3 | 4 5 6 7 |
| R=2 1311 | right shift out (A) | - 16 17 | - 0 1 | - 4 5 | - 8 9 | - 12 13 | - - - | - - - |
| 1312 | right shift out (B) | x x - - | 2 3 - - | 6 7 - - | 10 11 | 14 15 - - | 0 1 2 3 | 4 5 6 7 |
| 1313 | 1st register | | | 2 3 - - | 6 7 - - | 10 11 - - | 14 15 - - | 0 1 2 3 |
| 1314 | 2nd register | | - 16 17 | | | | - 16 17 | |
| 1315 | block out | | 1402 | 2 3 4 5 | 6 7 8 9 | 10 11 12 13 | 14 15 16 17 | 0 1 (2 3) |
| | block index | 4 | 0 | 1 | 2 | 3 | 0 | 1 |
| BC 1 | block in | 16 17 x x | 0 1 2 3 | 4 5 6 7 | 8 9 10 11 | 12 13 14 15 | 0 1 2 3 | 4 5 6 7 |
| R=3 | right shift out (A) | 16 17 x | 0 1 2 | 4 5 6 | 8 9 10 | 12 13 14 | - - 0 | - - 4 |
| 1212 | right shift out (B) | x - - - | 3 - - - | 7 - - - | 11 - - - | 15 - - - | 1 2 3 - | 5 6 7 - |
| | 1st register | | | 3 - - - | 7 - - - | 11 - - - | 15 - - - | 1 2 3 - |
| | 2nd register | | 16 17 (x) | | 1412, 1105 | | 16 17 x | |
| | block out | | | 3 4 5 6 | 7 8 9 10 | 11 12 13 14 | 15 16 17 0 | 1 2 (3 4) |
| | block index | 4 | 1 | 2 | 3 | 4 | 0 | 1 |
| BC 2 | block in | 16 17 x x | 4 5 6 7 | 8 9 10 11 | 12 13 14 15 | 16 17 0 1 | 0 1 2 3 | 4 5 6 7 |
| R=4 | right shift out (A) | | - - - | - - - | - - - | - - - | - 0 1 | - 4 5 |
| 1213 | right shift out (B) | | 4 5 6 7 | 8 9 10 11 | 12 13 14 15 | 16 17 0 1 | 2 3 - - | 6 7 - - |
| | 1st register | | | 4 5 6 7 | 8 9 10 11 | 12 13 14 15 | 16 17 0 1 | 2 3 - - |
| | 2nd register | | | | | | | |
| | block out | | | 4 5 6 7 | 8 9 10 11 | 12 13 14 15 | 16 17 0 1 | 2 3 (4 5) |
| | block index | 4 | 1 | 2 | 3 | 0 | 1 | 2 |
| BC 3 | block in | 16 17 x x | 4 5 6 7 | 8 9 10 11 | 12 13 14 15 | 0 1 2 3 | 4 5 6 7 | 8 9 10 11 |
| R=7 | right shift out (A) | 16 17 x | 4 5 6 | 8 9 10 | 12 13 14 | - - 0 | - - 4 | - - 8 |
| 1214 | right shift out (B) | x - - - | 7 - - - | 11 - - - | 15 - - - | 1 2 3 - | 5 6 7 - | 9 10 11 - |
| | 1st register | | | 7 - - - | 11 - - - | 15 - - - | 1 2 3 - | 5 6 7 - |
| | 2nd register | | - 16 17 | | | 16 17 (x) | | |
| | block out | | | (7 8) 9 10 | 11 12 13 14 | 15 16 17 0 | 1 2 3 4 | 5 6 (7 8) |
| | | | | 1404 | | 1105, 1414 | 1402 | 1403 |

COMMUNICATION DEVICE WITH LOW DENSITY PARITY CHECK ROTATOR, AND METHOD THEREFOR

FIELD OF THE INVENTION

The field of the invention relates to a Low Density Parity Check (LDPC) rotator circuit for LDPC encoding and decoding, a communication device, and a method for computation of LDPC rotation in an LDPC encoder or decoder. The field of the invention is applicable to, but not limited to, channel coding for current and future generations of communication standards.

BACKGROUND OF THE INVENTION

LDPC Coding

As shown in FIG. 1, a Low-Density Parity Check (LDPC) code may be used to protect data from errors that are imposed during unreliable transmission or storage. The data is typically represented by a vector comprising K data symbols, each of which can take a value in the range '0' to 'M−1', where M is the radix of the code. While extensive research has been conducted on the topic of non-binary LDPC codes, with M typically adopting a value in the set {4, 8, 16, . . . }, it is binary LDPC codes with M=2 that are typically adopted in practical applications. Hence, for the sake of simplicity, the remainder of this background discussion assumes that the data vector 102 comprises K bits, each of which can take a value of '0' or '1'.

The known LDPC code operates using two processes, where the first process comprises LDPC encoding before unreliable transmission or storage and the second process comprises LDPC decoding afterwards. The LDPC encoder 103 and decoder 104 must adopt compatible parameterisations, which may be specified by a Parity Check Matrix (PCM) having N' columns, N'−K rows and populated with binary values of '0' and '1'. LDPC encoding uses the PCM H to convert the vector x 102 of K data bits into a vector y 105 of N' encoded bits, where N' is greater than K. This is typically achieved by setting the first K bits in the encoded bit vector (referred to as its systematic bits) equal to the K data bits of vector x 102, then setting the remaining N'−K bits (referred to as the parity bits), such that y·H=0 in the Galois Field GF (M), where '0' is a syndrome vector comprising N'−K 0-valued bits. As understood in the field, the 'Galois Field' notation for the case where M=2 means binary with the arithmetic function+mapping to an XOR function. Hence, it can be said that the first K columns in the PCM correspond to the data bits of vector x 102, while the set of all columns correspond to the N' encoded bits of vector y 105.

During unreliable storage or transmission, the vector y 105 of N' encoded bits is exposed to errors and is typically converted into a vector 106 of N' encoded soft bits, which express how likely each of the N' encoded bits of vector y 105 is to have a value of '0' or '1'. Typically, each soft bit is represented using a Logarithmic Likelihood Ratio (LLR), where:

$$LLR = \ln \frac{Pr(\text{bit} = 0)}{Pr(\text{bit} = 1)}.$$

Hence for the sake of simplicity, the remainder of this background discussion assumes that all soft bits are expressed using LLRs.

LDPC decoding 104 may then use the PCM to convert the vector of N' encoded LLRs 106 into a vector of K decoded bits 107. Provided that the errors introduced during transmission or storage are not too severe, the K decoded bits 107 are typically a reproduction of the K data bits of vector x 102 that were input into the encoder 103.

The 3GPP New Radio LDPC code

Referring back to FIG. 1, a known schematic of LDPC coding and related signal processing functions in a 3rd generation partnership project (3GPP) New Radio (NR) is shown. As shown in FIG. 1, LDPC codes are adopted to protect data from transmission errors in the 3GPP NR standard for fifth generation (5G) mobile communications [1]. In this application, the K data bits of 102 are formed as a concatenation of three separate bit vectors, where the first vector comprises K'−L information bits 108, the second vector comprises L bits introduced by a Cyclic Redundancy Check (CRC) encoder 109 and the third vector comprises K−K' bits introduced by filler bit insertion 110. Following LDPC encoding 103, rate-matching 111 is used to convert the resultant vector of N' encoded bits 105 into a vector of $E_r$ rate-matched bits 112. Following unreliable transmission, derate-matching 113 is used to convert the vector of $E_r$ rate-matched LLRs 114 into the vector of N' encoded LLRs 106, which are input into the LDPC decoder 104. Here, the N' encoded LLRs 106 may also include contributions from LLRs received during previous transmissions in a Hybrid Automatic Repeat Request (HARQ) process and stored using a HARQ buffer 115. Following LDPC decoding, filler bit removal 116 may be used to remove the K−K' filler bits from the vector of K decoded bits 107. Then a CRC decoder 117 may be used to check the CRC within the resultant vector of K' decoded bits 118, in order to determine if any uncorrected transmission errors remain. If not, then the CRC decoder can remove the L CRC bits and output the K'−L decoded information bits 119. Either way, the CRC decoder can also output a binary flag 120, to indicate whether or not the CRC check was successful.

The 3GPP New Radio LDPC code is specified by PCMs that are derived from two basegraphs, called BG1 and BG2. FIG. 2 and FIG. 3 illustrate known representations of BG1 200 and BG2 300 from 3GPP New Radio, respectively. Each basegraph comprises a matrix populated with binary values of '0' and '1'. BG1 200 has $n_1 = n_{c,1} + n_{e,1} = 68$ columns, which are split into $n_{c,1}=26$ core columns 201 on the left and $n_{e,1}=42$ extension columns 202 on the right. BG1 200 has $m_1 = m_{c,1} + n_{e,1} = 46$ rows, which are split into $m_{c,1}=4$ core rows 203 at the top and $m_{e,1}=n_{e,1}=42$ extension rows 204 at the bottom. Meanwhile, BG2 300 has $n_2 = n_{c,2} + n_{e,2} = 52$ columns, which are split into $n_{c,2}=14$ core columns 301 on the left and $n_{e,2}=38$ extension columns 302 on the right. BG2 300 has $m_2 = m_{c,2} + n_{e,2} = 42$ rows, which are split into $m_{c,2}=4$ core rows 303 at the top and $m_{e,2}=n_{e,2}=38$ extension rows 304 at the bottom.

In both basegraphs, the submatrix formed by the intersection of the core columns 201 and 301, and core rows 203 and 303, is densely populated with binary values of '1'. Indeed, 19 out of the $n_{c,1}=26$ core columns 201 have the binary value of '1' in each of the core rows 203 in BG1 200. Meanwhile, up to 10 out of the $n_{c,2}=14$ core columns 301 in FIG. 3 have the binary value of '1' in each of the core rows 303 in BG2 300. The submatrix formed by the intersection of the core columns 201 and 301 and the extension rows 204 and 304 is sparsely populated with binary values of '1', except for the first two columns that are referred to as the punctured core columns and which are densely populated with binary values of '1'. Indeed, no more than 9 out of the $n_{c,1}$=26 core columns 201 have the binary value of '1' in any of the extension rows 204 in BG1 200. Meanwhile, no more than 5 out of the $n_{c,2}$=14 core columns 301 have the binary value of '1' in any of the extension rows 304 in BG2 300.

The submatrix formed by the intersection of the extension columns 202 and 302 and the core rows 203 and 303 is completed by filling with binary values of 0 in both basegraphs BG1 200 and BG2 300. The square submatrix formed by the intersection of the extension columns 202 and 302 and the extension rows 204 and 304 is mostly filled with binary values of '0', except for the elements that sit on the diagonal that runs from the top left corner of the submatrix to the bottom right corner, which adopt a binary value of '1' in both basegraphs BG1 200 and BG2 300. Note that, in both basegraphs, some extension rows 204 and 304 are orthogonal to one or both of their neighbouring extension rows. Here, two rows (or two columns) can be considered to be orthogonal to each other if their logical AND is a vector comprising only binary values of '0'.

Note that depending on the function of the rate-matching, some of the extension columns 202 and 302 and the corresponding extension rows 204 and 304 may be deleted from the basegraph at run-time, before it is used to generate the PCM. Here, the extension row 204 and 304 that corresponds to a particular extension column 202 and 302 is the one that it shares a binary value of 1 with. This deletion reduces the number of extension columns 202 and rows 204 in BG1 200 from $n_{e,1}$ to $n'_{e,1}$ and reduces the number of extension columns 302 and rows 304 in BG2 300 from $n_{e,2}$ to $n'_{e,2}$. Hence, the number of columns becomes $n'_1=n_{c,1}+n'_{e,1}$ and $n'_2=n_{c,2}+n'_{e,2}$, for BG1 200 and BG2 300 respectively, while the number of rows becomes $m'_1=m_{c,1}+n'_{e,1}$ and $m'_2=m_{c,2}+n'_{e,2}$, for BG1 200 and BG2 300 respectively.

The PCM used at run-time for a particular LDPC encoding and decoding process is obtained by selecting one or other of the basegraphs BG1 200 and BG2 300 and lifting it using a lifting factor Z, for which 51 values of up to $Z_{max}$=384 are supported in 3GPP New Radio. Here, each binary element in the basegraph BG1 200 and BG2 300 is replaced by a submatrix having dimensions of Z×Z. Hence, each row or column in the basegraph BG1 200 and BG2 300 corresponds to a set of Z rows (referred to as a block row) or a set of Z columns (referred to as a blockcolumn) in the PCM. Furthermore, a PCM derived from BG1 200 comprises N'=$n'_1$Z columns and N'−K=$m'_1$Z rows, while a PCM derived from BG2 300 comprises N'=$n'_2$Z columns and N'−K=$m'_2$Z rows. In the case of BG1 200, K=22Z and the first 22 blockcolumns correspond to the data bits×102. Meanwhile, K=10Z in the case of BG2 300, where the first 10 blockcolumns correspond to the data bits 102. In 3GPP New Radio, the values of K and Z are selected according to a set of rules, dependent on the value of K'.

Binary elements in the basegraph having the value '0' are replaced by a Z×Z submatrix filled with binary values of '0'. By contrast, binary elements in the basegraph having the value '1' are replaced by a submatrix in which Z elements adopt a binary value of '1' and the remaining Z×(Z−1) elements adopt a binary value of '0'. In the extension blockcolumns, these Z 1-valued binary elements are positioned on the diagonal that runs from the top left corner of the Z×Z submatrix 401 to the bottom right corner. By contrast, in the core blockcolumns, these Z 1-valued binary elements are positioned according to a circular rotation 402 of this diagonal, as illustrated in FIG. 4. More specifically, FIG. 4 illustrates a known matrix interpretation of various example rotations applied with exampling lifting factors Z, in order to convert between natural and rotated orderings of variables. The diagonal used for each 1-valued binary element in the core blockcolumns is rotated by a different number of positions in the range '0' to 'Z−1', dependent on the particular basegraph and value of Z selected at run-time.

A Conventional LDPC Decoder Implementation

While many LDPC decoder implementations have been proposed previously, this background discussion focuses on a row-parallel layered belief propagation implementation [2], as illustrated in FIG. 5. FIG. 5 illustrates a known row-parallel layered belief propagation implementation of an LDPC decoder, with application for the 3GPP New Radio LDPC code. In general, this type of implementation can be designed to support any number of basegraphs at run-time, having any dimensions and sets of supported lifting factors Z. However, for the sake of simplicity, this background discussion considers an implementation that is specifically designed to offer run-time support for both 3GPP New Radio basegraphs and all corresponding lifting factors Z. The implementation of [2] 500 comprises $n_{c,max}$=max($n_{c,1}$,$n_{c,2}$) core Variable Node (VN) memories, one extension VN memory 502, $n_{c,max}$ rotators 505 and one Check Node (CN) processor, which are all operated under the control of a controller 506. Each of the $n_{c,max}$ core VN memories 503 is connected to an Input-Output (I-O) port 504 of the CN processor 501 via a corresponding one of the $n_{c,max}$ rotators 505. Meanwhile, the extension VN memory 502 is connected directly to an I-O port 504 of the CN processor 501. Hence, the CN processor 501 is connected to a total of $n_{c,max}$+1 VN memories 502 and 503, either via a corresponding rotator 505 or directly. The VN memories 502 and 503, rotators 505 and CN processor 501 may be designed to adopt a parallelism of P, such that each connection can transfer P number of LLRs at a time. Thus, different memory configurations are known.

In the considered row-parallel architecture, each of the $n_{c,1}$ or $n_{c,2}$ core blockcolumns in the PCM is mapped to a different one of the core VN memories 503 and the set of the $n'_{e,1}$ or $n'_{e,2}$ extension blockcolumns is mapped to the extension VN memory 502. Here, the extension VN memory 502 comprises $n'_{e,1}$ or $n'_{e,2}$ sub-memories, each of which is mapped to a different one of the extension blockcolumns. Note that there is only a single binary value of '1' in each extension blockcolumn 202 and 302 respectively of the basegraphs of FIG. 2 and FIG. 3. The inventors of the present invention have recognised and appreciated that each sub-memory in the extension VN memory 502 is equivalently mapped to the one of the $m'_{e,1}$ or $m'_{e,2}$ extension block rows that corresponds to the row of the basegraph that accommodates this binary value of '1'. The LDPC decoding process is initialised by loading each successive set of Z LLRs from the vector of N' encoded LLRs 106 into the VN memory or sub-memory that corresponds to each successive blockcolumn in the PCM. Note that the LLRs loaded into the core VN memories 503 corresponding to the first two blockcolumns (which are referred to as the punctured blockcolumns) typically adopt values of '0' in the 3GPP New Radio LDPC code. Meanwhile, the LLRs that correspond to the K−K' filler bits typically adopt large positive LLR values.

The conventional LDPC decoder implementation performs an LDPC decoding process using a number of iterations, where each iteration completes one pass of processing over the PCM. Each iteration is comprised of processing performed for each block row of the PCM, where the order in which the block rows are processed within each iteration is dictated by a layered belief propagation schedule. The processing of each block row of the PCM is comprised of a number of LDPC decoding functions, where each function performs processing for a set of P rows within the block row. Each LDPC decoding function comprises a first sub-step and a second sub-step. A number of processes are performed during each sub-step and these may be spread over a number of consecutive clock cycles.

More specifically, the LDPC decoding process is completed over a number of steps. Each step processes LLRs associated with P rows within the same block row of the PCM, where these rows are typically consecutive. Typically, the complete set of rows within a block row are processed during a group of ceil(Z/P) consecutive steps, with each successive step typically processing successive sets of P rows in order. More specifically, in the case where Z is not divisible by P, P rows are processed during each of floor(Z/P) of the consecutive steps, while mod(Z,P) rows are processed during the remaining step. Note that the 'ceil' function rounds a fraction up to the lowest integer having a greater or equal value. By contrast, the 'floor' function rounds a fraction down to the highest integer having a less than or equal value. Finally, the 'mod' function provides the remainder part of a fraction.

Furthermore, the block rows are typically processed in an order dictated by a schedule, which may repeat the processing of some or all of the block rows over numerous iterations. During each step of the LDPC decoding process, binary values of '1' in the core columns 201 and 301 of the corresponding row of the basegraph are used to activate the associated rotators 505, core VN memories 503 and CN processor I-O ports 504 of FIG. 5.

During the first sub-step of each step of the LDPC decoding process, each of the activated core VN memories (say core VN memories 503 in FIG. 5) are read under the direction of the controller (say controller 506 in FIG. 5), in order to provide the P LLRs that are required to complete the processing of the P rows of the PCM. Furthermore, each of the activated rotators (say activated rotators 505 in FIG. 5) is configured to rotate these P LLRs into the order required to complete this processing, which is performed under the direction of the controller and according to the rotations used to convert the basegraph 200 and 300 into the PCM. Each activated rotator provides the corresponding set of P LLRs to the input of the corresponding I-O port (say I-O port 504 of the CN processor 501 in FIG. 5). The inventors of the present invention have recognised and appreciated a need to address a problem of implementing an efficient LDPC rotator circuit for a practical communication device, that uses LDPC encoding and/or decoding.

Furthermore, during the first sub-step in each step of the LDPC decoding process that corresponds to an extension row 204 and 304 in the basegraph, the CN processor 501 is also provided with a set of P LLRs that are read from the extension VN memory (say extension VN memory 502 in FIG. 5). More specifically, these LLRs are provided by the particular sub-memory in the extension VN memory that is mapped to that extension row 204 and 304. By contrast, the extension VN memory is deactivated during the first sub-step of each step of the LDPC decoding process that corresponds to a core row 203 and 303 in the basegraph, with the result that it does not provide any LLRs to the CN processor.

In the manner described above, the activated subset of the connections to the inputs of the I-O ports of the CN processor each provide it with a set of P LLRs in the first sub-step of each step of the LDPC decoding process. In response to this, the CN processor performs P sets of calculations in parallel, for the P associated rows of the PCM. This may be achieved using a variety of algorithms [3], including the sum-product, min-sum, normalised min-sum, offset min-sum or adjusted min-sum, for example. The CN processor typically employs internal memory to assist these calculations using results obtained during the previous iteration of processing the P associated rows of the PCM. These results are typically overwritten with new results, which can be used to assist the next iteration of processing the P associated rows of the PCM. In the second sub-step in each step of the LDPC decoding process, and following the completion of all calculations performed by the CN processor, it may use outputs from its I-O ports to provide a set of P LLRs to each of its connections that are activated in the current step of the LDPC decoding process.

For example, in the first sub-step of an LDPC decoding process performed for a set of P rows in the PCM, the CN processor may combine P LLRs provided by inputs to each of its A activated I-O ports using the min-sum algorithm. Here, we may represent the input LLRs using the notation $a_{i,p}$ where i is in the range 1 to A and indicates which of the A activated I-O ports the LLR is provided on, and p is in the range 1 to P and indicates which of the P LLRs provided on that I-O port this LLR is. In a first calculation, the CN processor may perform a calculation $b_{i,p}=a_{i,p}-m_{i,p}$ corresponding to each input LLR $a_{i,p}$, where $m_{i,p}$ is a corresponding internally stored value, which is initialised to '0' at the start of the LDPC decoding process and which is updated in each iteration of the processing of the P rows in the PCM. Following this, the first and second minimum of the absolute values $|b_{i,p}|$ is identified for each value of p and the corresponding values of the index i are referred to as min1 and min2, respectively. Furthermore, the product of the signs $sign(b_{i,p})$ is identified for each value of p and referred to as $sign_p$, where sign(x) is '+1', if x is not less than '0', and '−1' otherwise.

In the second sub-step, the CN processor may perform a calculation $m_{min1,p}=sign(b_{min1,p}) \times sign_p \times |b_{min2,p}|$ corresponding to the input LLR $a_{i,p}$ having the index i that equals min1 for each value of p. Meanwhile, a calculation $m_{i,p}=sign(b_{i,p}) \times sign_p \times |b_{min1,p}|$ is performed corresponding to all other input LLRs for each value of p. Here, the value of $m_{i,p}$ is written into the internally stored value for each combination of i and p, so that it can be used during the next iteration of the processing of the P rows, as described above. Finally, the CN processor may perform a calculation $d_{i,p}=b_{i,p}+m_{i,p}$, in order to obtain an output LLR $d_{i,p}$ for each of the P LLRs provided as outputs on each of the A activated I-O ports, in correspondence with the input LLR $a_{i,p}$.

Following this, the second sub-step, in each step of the LDPC decoding process, proceeds with each of the activated rotators being configured to rotate the set of P LLRs that it is provided with, into an order that is appropriate for storage in the corresponding activated core VN memory. Again, the function of a conventional rotator circuit is described in a section below. The inventors of the present invention have recognised and appreciated a further problem that is described below, which may be addressed by the present invention. Furthermore, during the second sub-step in each step of the LDPC decoding process, the CN processor may also calculate syndrome bits corresponding to the P associated rows of the PCM. Additionally, during the second sub-step in each step of the LDPC decoding process that corresponds to an extension row (for example 204 and 304 in the basegraphs BG1 200 and BG2 300 of FIG. 2 and FIG.

3), the set of P LLRs that the CN processor provides to the extension VN memory may be written to the one of its sub-memories that is mapped to that extension row.

Following the completion of the decoding iterations within the LDPC decoding process, a vector of N' decoded LLRs may be obtained by concatenating the sets of Z LLRs that were most recently stored in the VN memories 502 and 503. The vector of K decoded bits 107 may then be obtained with consideration of the signs of the first K decoded LLRs, where positive LLRs may be converted into the binary values of '0', while negative LLRs may be converted into binary values of '1'.

In summary, FIG. 5 shows a row parallel design for a LDPC decoder. Here, the CN processor 501 accepts input LLRs from multiple column memories 503 in each step. This enables processing for each of these columns to occur in the same step, achieving a high throughput. In a quasi-cyclic LDPC code like that of 3GPP, the basegraph dictates that a different cyclic rotation value should be applied to the LLRs read from each block column RAM. This results in the CN processor 501 being connected to each column RAM through a rotator circuit 505, each may be operating with a different rotation value. In order to achieve a high throughput, the CN processor 501 may operate on P rows in parallel within the Z rows of the block row. This means that the CN processor 501 requires P LLRs from each block column in each step. The output from the RAM, and the input and output of the rotator will therefore have to convey P LLRs in each step. For the RAM, this will result in each address containing P LLRs. The rotator will also have to operate over P LLRs, with the additional challenge that the rotation value may not be aligned to P. Additionally, Z may also not be aligned to P. Note that the column RAMs will be read during the processing of different block rows. Each block row may have a different rotation value. This prevents the elements in each column RAM from being arranged in a specific way for a given rotation, requiring different rotations to be applied by the rotators when operating on different block rows, at run time. Again, the inventors of the present invention have recognised and appreciated a further problem, namely that of implementing an efficient LDPC rotator circuit for a practical communication device, that uses LDPC encoding or decoding, which may be addressed by the present invention.

SUMMARY OF THE INVENTION

The present invention provides circuits for LDPC rotators and methods for LDPC rotation using parallel processing in an LDPC encoder or decoder, for example with reduced number of operations. In particular, examples of the present invention details efficient mappings between hardware components and algorithmic features. Specific example embodiments of the invention are set forth in the dependent claims. These and other aspects of the invention will be apparent from, and elucidated with reference to, the example embodiments described hereinafter.

In a first aspect of the invention, a communication device comprises: a low density parity check, LDPC, rotator circuit having an input and an output, wherein the LDPC rotator circuit is configured to have a parallelism, P, of at least two, and configured to perform a rotation function comprising a series of operations that rotates a data sequence comprising a first number, Z, of data values by a second number, R, of positions, wherein a series of ceil(Z/P) input blocks each comprising P number of input values is accepted by the input during a first subset of the series of operations, and wherein a series of ceil(Z/P) output blocks each comprising P number of output values are provided by the output during a second subset of the series of operations, wherein the second subset of operations begins before the first subset of operations has completed; wherein the LDPC rotator circuit comprises, or is operably coupled to, a controller arranged to control the rotation function performed by the LDPC rotator circuit. The LDPC rotator circuit comprises: a first set of one or more registers that is written with one or more registered values that are derived from one or more input values that are accepted by the input during one or more previous operations and is operably coupled to the controller; a second set of one or more registers operably coupled to the controller; at least one shifting circuit, operably coupled to the controller, configured to receive shifting input values that are operably coupled to the P number of input values and apply a left shift and apply a right shift in order to provide shifting output values; and at least one combining circuit operably coupled to the controller, and operably coupled to at least one of: the shifting output values, the first set of one or more registers, the second set of one or more registers; and configured to provide the P number of output values to the output. A number floor(Z/P) of the series of ceil(Z/P) input blocks comprise input values that are provided by a number P of the Z data values and one input block of the series of ceil(Z/P) input blocks is a padded input block that comprises input values that are provided by a number mod(Z,P) of the Z data values and a number P-mod(Z,P) of padding values when Z is not a multiple of P. The second set of one or more registers is written under direction of the controller with one or more registered values that are derived from one or more input values that are accepted by the input before a second subset of the series of operations begins and wherein the one or more registered values are not overwritten before the padded input block is accepted by the input, and at least one of the P output values in at least one of the output blocks is a function of at least one registered value in the second set of one or more registers. In this manner, the need to stall the rotator circuit is mitigated, thereby improving the latency, throughput and efficiency of the communication device. In this manner, the rotator circuit can efficiently generate the output block, based on simple shifting and combining circuits, improving the efficiency of the communication device.

In an optional example, the parallelism, P, is common to all rotation functions performed by the LDPC rotation circuit and the first number, Z, of data values and the second number, R, of positions vary between rotation functions. In this manner, the communication device offers run-time flexibility over the Z and R parameters, which enables the required run-time flexibility over block length, coding rate and base graph selection in standardised application of LDPC codes.

In an optional example, the series of operations comprises at least ceil(Z/P)+2 operations, wherein the first subset of the series of operations comprises at least ceil(Z/P) operations and the second subset of the series of operations comprises at least ceil(Z/P) operations. In this manner, the latency of the rotator circuit is small, which improves the latency, throughput and efficiency of the communication device.

In an optional example, the first set of one or more registers is written with one or more registered values that are derived from one or more input values during at least one operation of the LDPC rotator circuit and at least one of the P output values in at least one of the output blocks is a function of at least one registered value in the first set of one or more registers. In this manner, the first set of registers can efficiently store input values that are not needed for the current output block, but that are required for the next output block.

In an optional example of the padded input block is configured to adopt one of the following:
- the P-mod(Z,P) padding values occupy a last P-mod(Z,P) positions in the padded input block and wherein the P-mod(Z,P) padding values are set to zero;
- the P-mod(Z,P) padding values occupy a first P-mod(Z,P) positions in the padded input block and wherein the P-mod(Z,P) padding values are set to zero;
- the P-mod(Z,P) padding values occupy a last P-mod(Z,P) positions in the padded input block and wherein the P-mod(Z,P) padding values are set equal to a first P-mod(Z,P) input values from an input block that immediately follows the padded input block in the series of ceil(Z/P) input blocks;
- the P-mod(Z,P) padding values occupy a last P-mod(Z,P) positions in the padded input block and the padded input block is a last input block in the series of ceil(Z/P) input blocks and wherein the P-mod(Z,P) padding values are set equal to a first P-mod(Z,P) input values from a first input block in the series of ceil(Z/P) input blocks;
- the P-mod(Z,P) padding values occupy a first P-mod(Z,P) positions in the padded input block and wherein the P-mod(Z,P) padding values are set equal to a last P-mod(Z,P) input values from an input block that immediately precedes the padded input block in the series of ceil(Z/P) input blocks;
- the P-mod(Z,P) padding values occupy a first P-mod(Z,P) positions in the padded input block and the padded input block is a first input block in the series of ceil(Z/P) input blocks and wherein the P-mod(Z,P) padding values are set equal to a last P-mod(Z,P) input values from a last input block in the series of ceil(Z/P) input blocks.

In this manner, the rotator circuit can mitigate the need to stall the rotator circuit when dealing with the padding values, improving the latency, throughput and efficiency of the communication device.

In an optional example, a first input block in the series of ceil(Z/P) input blocks contains a $(\mod(R,Z)+1)^{th}$ data value that is provided to the input of the LDPC rotator circuit during the first operation in the first subset of operations, and wherein each successive input block is provided to the input of the LDPC rotator circuit during each successive operation in the first subset of operations, with the input block containing a first data value in the data sequence being provided to the input of the LDPC rotator circuit during the operation in the first subset of operations that follows an operation when the input block containing a last data value in the data sequence is provided to the input of the LDPC rotator circuit. In this manner, the rotator circuit can mitigate the need to stall the rotator circuit when dealing with the padding values, improving the latency, throughput and efficiency of the communication device.

In an optional example, the at least one combining circuit comprises a bank of OR gates and wherein the left shift and right shift applied by the at least one shifting circuit use zero padding. In this manner, the combining circuit comprises only simple logic gates, thereby improving the efficiency of the communication device.

In an optional example the second set of one or more registers is further operably coupled to the at least one shifting circuit, and arranged to provide the at least one combining circuit with one or more shifting output value derived from one of the following: the padded input block; an input block that immediately follows the padded input block in the series of ceil(Z/P) input blocks; a first input block in the series of ceil(Z/P) input blocks when the padded input block is a last input block in the series of ceil(Z/P) input blocks. In this manner, the rotator circuit can mitigate the need to stall the rotator circuit when dealing with the padding values, thereby improving the latency, throughput and efficiency of the communication device.

In an optional example, one or more masking circuit(s) is arranged to connect the second set of one or more registers and the at least one shifting circuit to the at least one combining circuit, wherein the one or more masking circuit is configured to determine whether the combining input values are derived from the shifting output values or whether they are derived from dummy values. In this manner, the provision of the shifting output values to the combining circuit can be efficiently disabled when not required.

In an optional example, the first set of one or more registers comprises one register, the second set of one or more registers comprises one register, the input values are provided as shifting input values to the at least one shifting circuit, and wherein the registered values of the first set of one or more registers and the second set of one or more registers are provided by shifting output values, and wherein the combining input values are provided by: the registered values of the second set of one or more registers via the one or more masking circuits; and the registered values of the first set of one or more registers; and the shifting output values of the at least one shifting circuit. In this manner, the rotation function can be efficiently completed, while mitigating the need to stall the rotator circuit when dealing with the padding values, thereby improving the latency, throughput and efficiency of the communication device.

In an optional example, the first set of one or more registers comprises two registers, wherein an input of a second register in the first set of one or more registers is operably coupled to an output of a first register in the first set of one or more registers to form a shift register; wherein the second set of one or more registers comprises two registers, which are written with the input block in the series of ceil(Z/P) inputs blocks containing a $(\mod(R,Z)+1)^{th}$ data value, and written with either: the input block in the series of ceil(Z/P) input blocks that immediately follows the input block in the series of ceil(Z/P) inputs blocks containing the $(\mod(R,Z)+1)^{th}$ data value; or the first input block in the series of ceil(Z/P) input blocks when the input block in the series of ceil(Z/P) inputs blocks containing the $(\mod(R,Z)+1)^{th}$ data value is the last input block in the series of ceil(Z/P) input blocks; and wherein the second set of one or more registers is configured to be not overwritten before the second subset of operations ends. In this manner, the rotation function can be efficiently completed, while mitigate the need to stall the rotator circuit when dealing with the padding values, and while enabling two successive rotation functions to be completed without any pipeline warm down required, thereby improving the latency, throughput and efficiency of the communication device.

In an optional example, at least one multiplexing circuit is configured to multiplex the registered values of the first and second sets of registers and provide the shifting input values for the at least one shifting circuit. In this manner, the required inputs to the combining circuits can be efficiently provided.

In an optional example, the rotation function performed by the LDPC rotator circuit comprises a first rotation function pipelined with a second rotation function, wherein a first operation in the first subset of operations of the second rotation function precedes a last operation in the second subset of operations of the first rotation function, and wherein a first operation in the second subset of operations of the second rotation function immediately follows a last operation in the second subset of operations of the first rotation function. In this manner, two successive rotation functions to be completed without any pipeline warm-down are required, improving the latency, throughput and efficiency of the communication device.

In an optional example, when performing a rotation function in which Z is less than P, the rotation function is performed in a single operation. In this manner, the described special case can be dealt with using a minimal number of operations, thereby improving the latency, throughput and efficiency of the communication device.

In an optional example, when performing a rotation function in which Z is a multiple of P, the series of operations comprises at least ceil(Z/P)+1 operations. In this manner, the described special case can be dealt with using a minimal number of operations, thereby improving the latency, throughput and efficiency of the communication device.

In a second aspect of the invention, a method for computation of LDPC rotation in an LDPC encoder or decoder that comprises a low density parity check, LDPC, rotator circuit having an input, an output, a first set of one or more registers that is written with one or more registered values that are derived from one or more input values that are accepted by the input during one or more previous operations operably coupled to a controller, a second set of one or more registers operably coupled to the controller and a parallelism, P, of at least two, is described. The method comprises: configuring a rotation function by the LDPC rotator circuit comprising a series of operations that rotates a data sequence comprising a first number, Z, of data values by a second number, R, of positions, accepting a series of ceil(Z/P) input blocks, each comprising P number of input values, by the input during a first subset of the series of operations, and receiving shifting input values that are operably coupled to the P number of input values and applying a left shift and applying a right shift by at least one shifting circuit in order to provide shifting output values; providing by the output during a second subset of the series of operations a series of ceil(Z/P) output blocks, each comprising P number of output values, output by at least one combining circuit operably coupled to the controller, and arranged to operably combine outputs originating from at least one of: the controller, the shifting output values, the first set of one or more registers and the second set of one or more registers, and providing the P number of output values to an output; wherein the second subset of operations begins before the first subset of operations has completed. The LDPC rotator circuit comprises, or is operably coupled to, the controller arranged to control the rotation function performed by the LDPC rotator circuit. A number floor(Z/P) of the series of ceil(Z/P) input blocks comprise input values that are provided by a number P of the Z data values and one input block of the series of ceil(Z/P) input blocks is a padded input block that comprises input values that are provided by a number mod(Z,P) of the Z data values and a number P-mod(Z,P) of padding values when Z is not a multiple of P. The method further comprises: accepting one or more input values by the input before a second subset of the series of operations begins, deriving one or more registered values from the one or more input values, and writing, under direction of the controller, the second set of one or more registers with the one or more derived registered values. The derived one or more registered values are not overwritten before the padded input block is accepted by the input, and at least one of the P output values in at least one of the output blocks is a function of at least one registered value in the second set of one or more registers. In this manner, the need to stall the rotator circuit is mitigated, thereby improving the latency, throughput and efficiency of the communication device.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

FIG. 4 illustrates a known matrix interpretation of various example rotations applied with exampling lifting factors Z, in order to convert between natural and rotated orderings of variables.

FIG. 9 illustrates the value of various signals in the parallel function of four instances of the conventional rotator, each for a different block column having a different R within a single block row.

FIG. 12 illustrates a value of various signals in a parallel function of four instances of the first improved rotator, each for a different block column having a different R within a single block row, in accordance with some examples of the present invention.

FIG. 14 illustrates a value of various signals in the parallel function of four instances of the second improved rotator, each for a different block column having a different R within a single block row, in accordance with some examples of the present invention.

FIG. 17 illustrates a value of various signals in a parallel function of four instances of the third improved rotator, each for a different block column having a different R within a pair of pipelined block rows, in accordance with some examples of the present invention.

DETAILED DESCRIPTION

The background discussion above has detailed the requirement for performing rotation functions during LDPC encoding and decoding. In a practical communication device, these functions may be performed by an LDPC rotator circuit. However, the following discussions will identify that a conventional implementation of an LDPC rotator circuit suffers from inefficiencies, which degrade the throughput, latency, hardware efficiency and power efficiency of a communication device that implements LDPC encoding or decoding. This motivates the subsequent discussions, which describe some features of the present invention, which aims to provide a solution of an efficient implementation of an LDPC rotator circuit.

A Conventional Rotator Implementation

Figure 1:
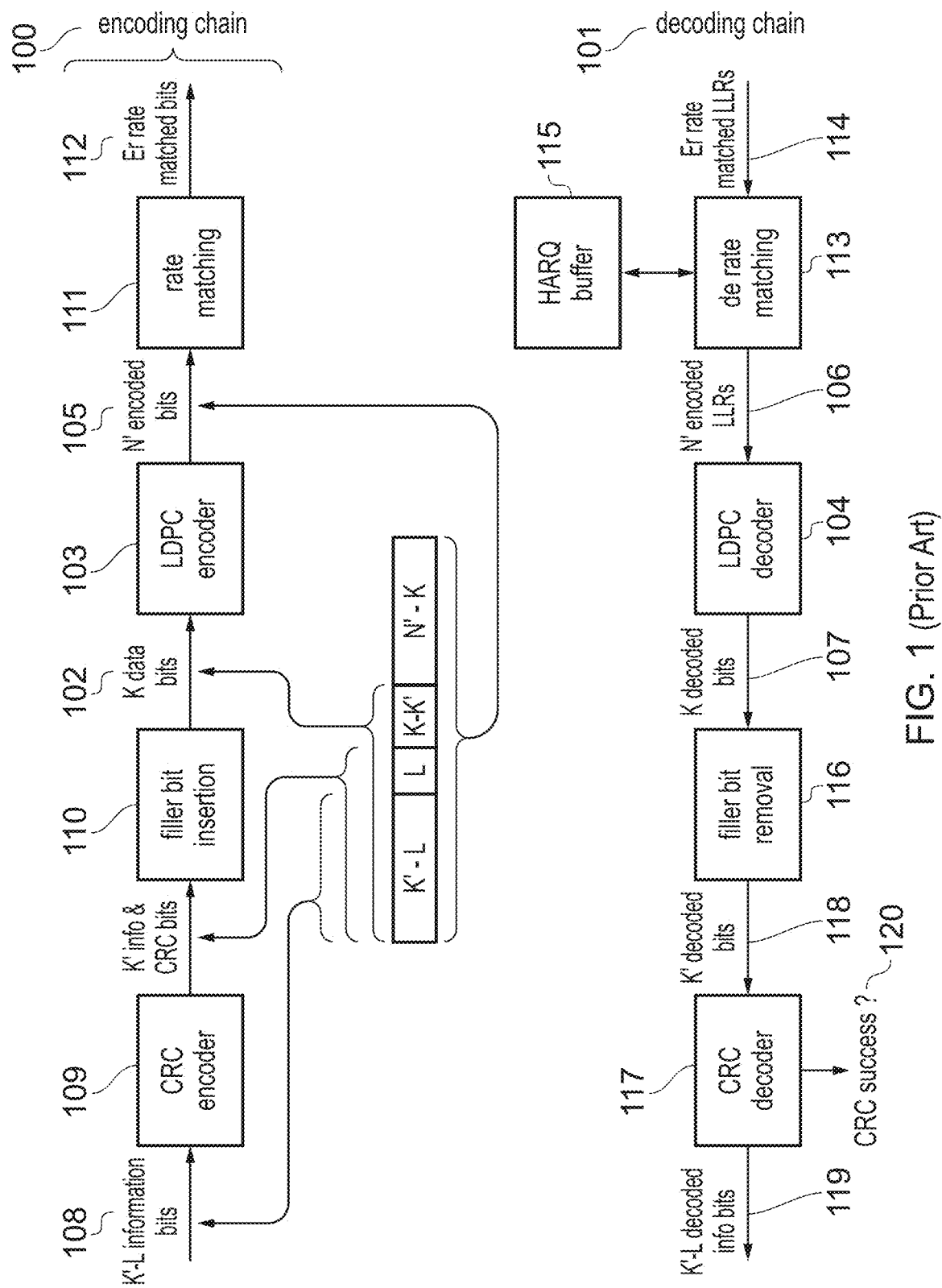
FIG. 1 illustrates a known schematic of LDPC coding and related signal processing functions in 3GPP New Radio.
Figure 2:
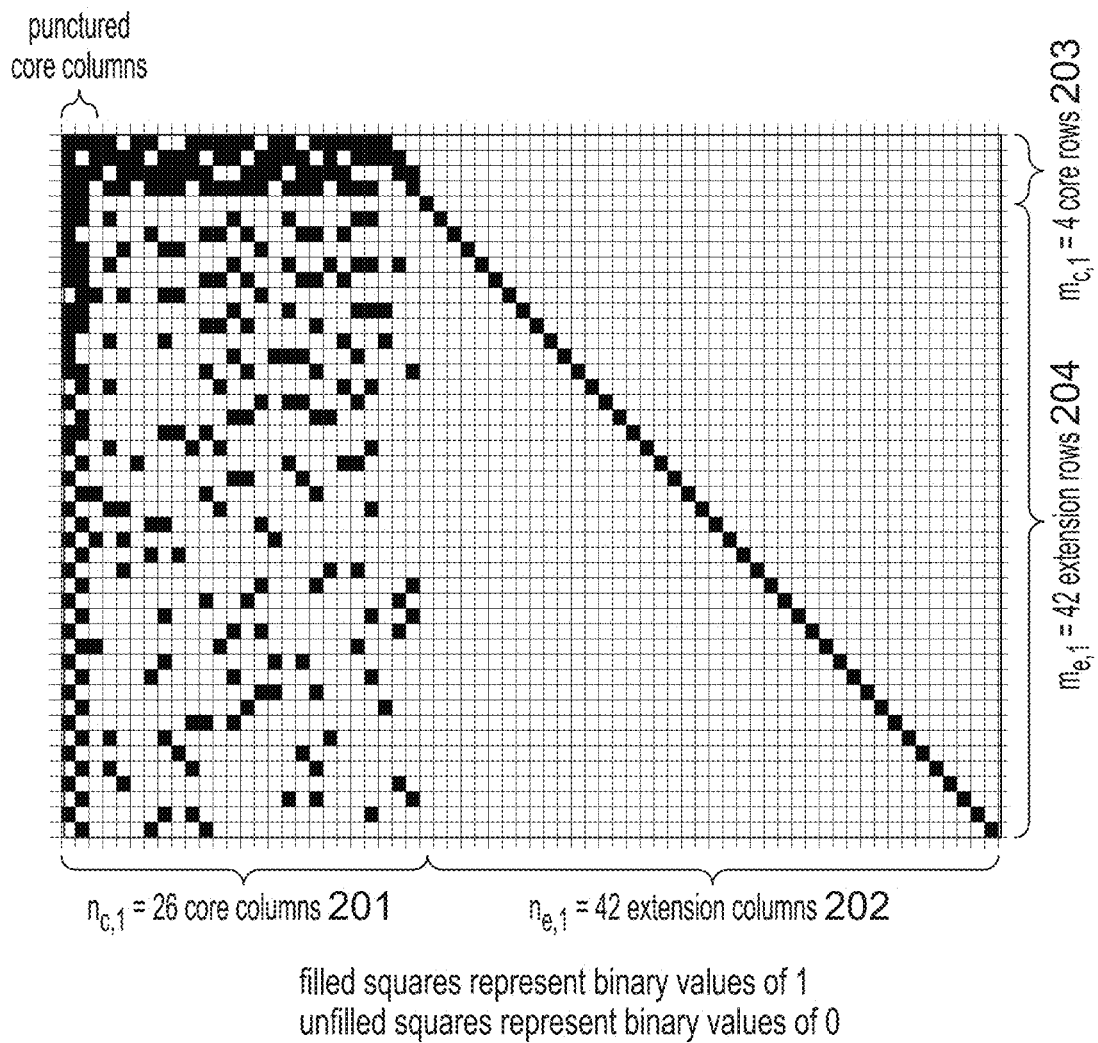
FIG. 2 illustrates a known representation of BG1 from 3GPP New Radio.
Figure 3:
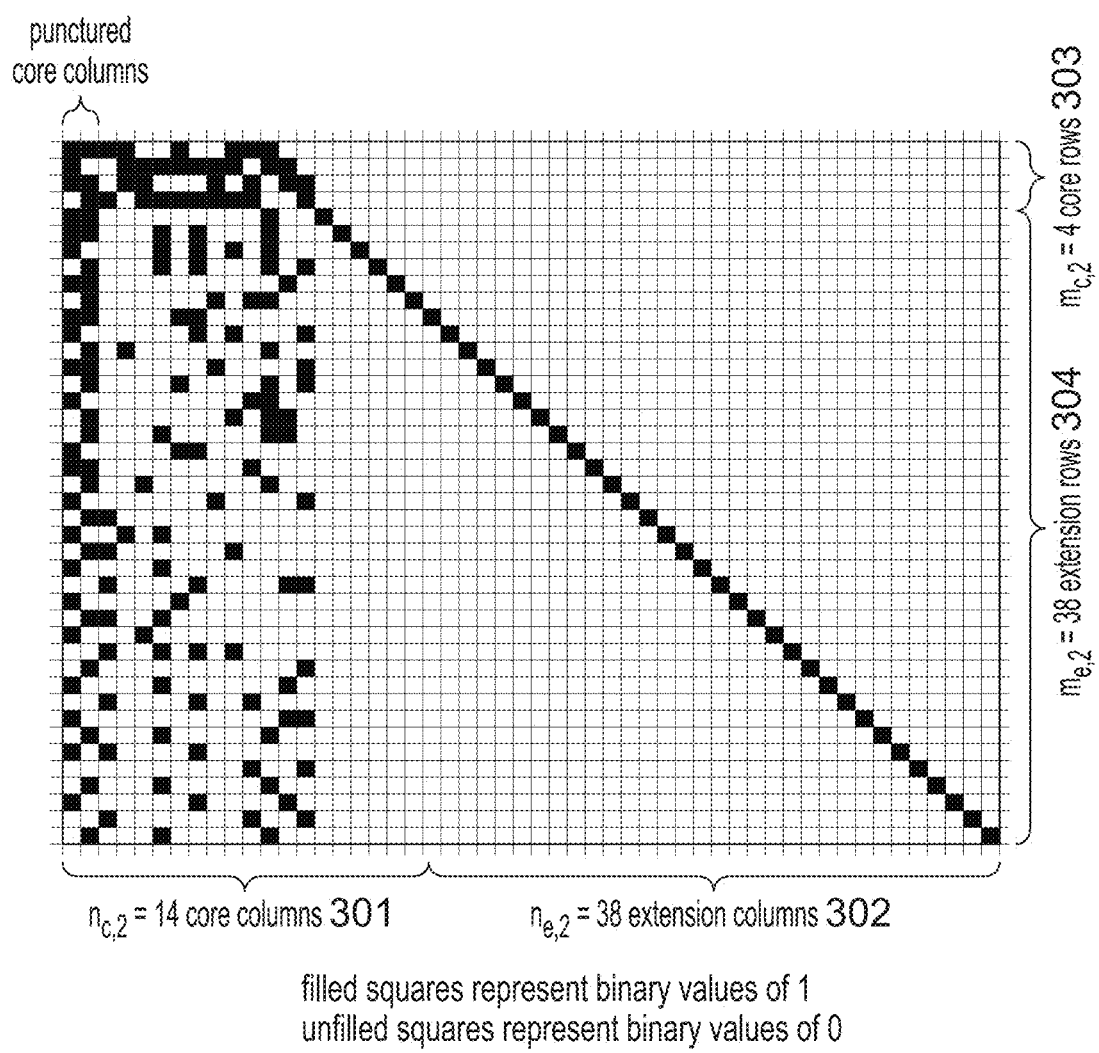
FIG. 3 illustrates a known representation of BG2 from 3GPP New Radio.
Figure 5:
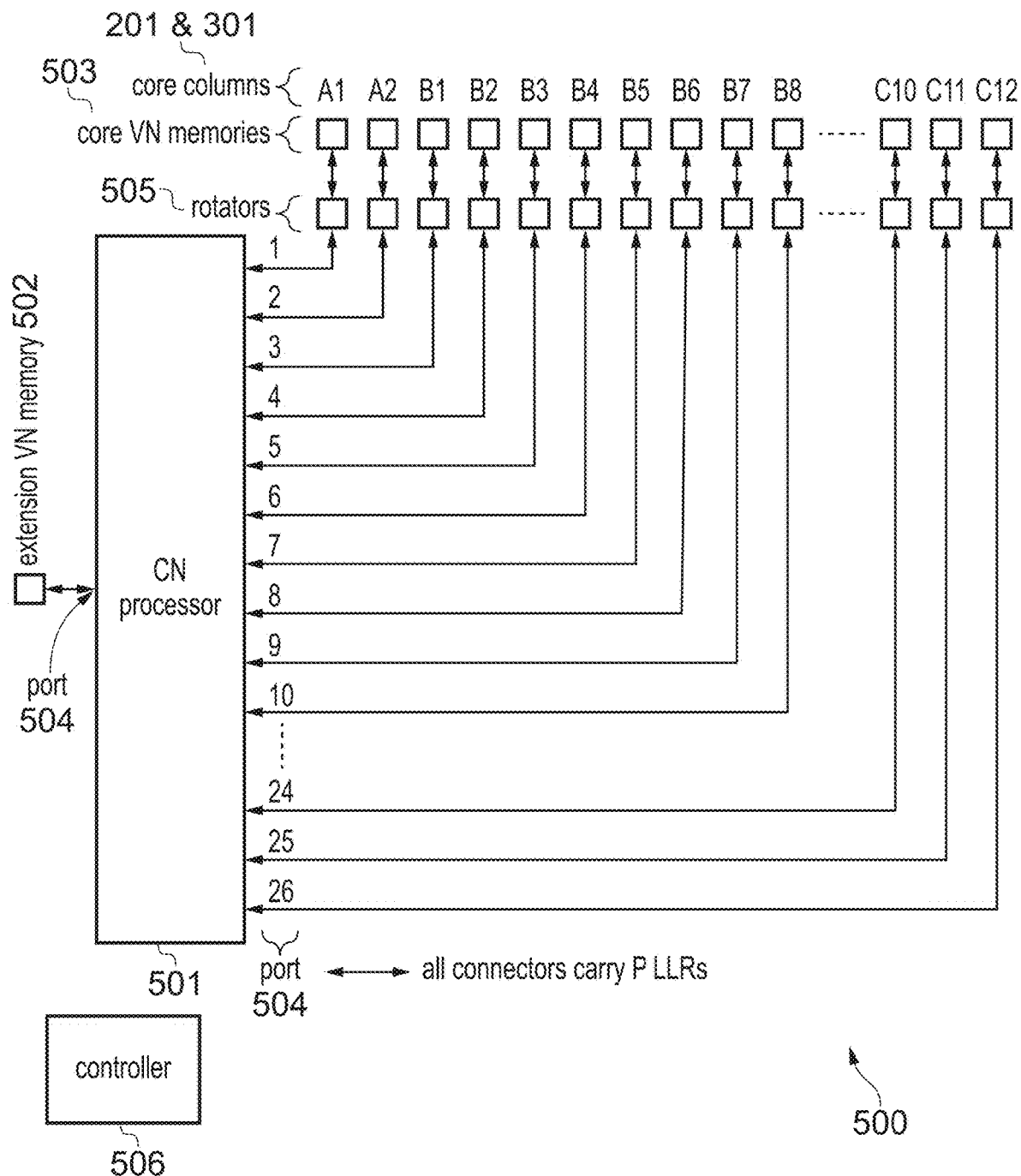
FIG. 5 illustrates a known row-parallel layered belief propagation implementation of an LDPC decoder, with application for the 3GPP New Radio LDPC code.

The rotation function described in the known conventional LDPC decoder implementation has an input comprising Z data values and an output comprising those same Z data values, but in a rotated order. More specifically, the amount of rotation to be applied by a rotation function may be described by a value R, which adopts a value in the range 0 to Z−1. When applying a rotation of R, the element in the input having a particular index k in [0,Z−1] becomes the element in the output of the rotation function having the index mod(k−R,Z). Note that a rotation of R'>=Z is equivalent to a rotation by R=mod(R',Z). Furthermore, a rotation by R is equivalent to a rotation in the opposite direction by Z−R. Note that in the case of an LDPC decoder of FIG. 5, the input to a rotator 505 may be provided by a RAM such as a VN memory 503, or by a processor such as the CN processor 501, as discussed in the section above. Furthermore, in an LDPC decoder, each of the Z data values represents an LLR, where a fixed-point twos complement number representation is typically adopted. Note that in accordance with the run-time flexibility of the LDPC encoder and decoder described in the background discussion, the rotation function is also required to support run-time flexibility over the values of R and Z. More specifically, the values of R and Z may vary between rotation functions.

It may be recognised that in analogy to the rotators of an LDPC decoder, rotators are also used during LDPC encoding. While a rotator in an LDPC decoder operates on LLRs as discussed above, it may be appreciated that a rotator in an LDPC encoder instead operates on bits. More specifically, rotators are adopted in an LDPC encoder to rotate blocks of P information bits, before they are combined using XOR functions, in order to generate parity bits. Furthermore, while the discussion in the sections above highlights the 3GPP LDPC code, which represents a particular implementation of a quasi-cyclic LDPC code, similar concepts are adopted in the quasi-cyclic LDPC codes of other applications, which therefore also require rotators. Hence, it is envisaged that the concepts described herein apply equally to such other applications.

Figure 7:
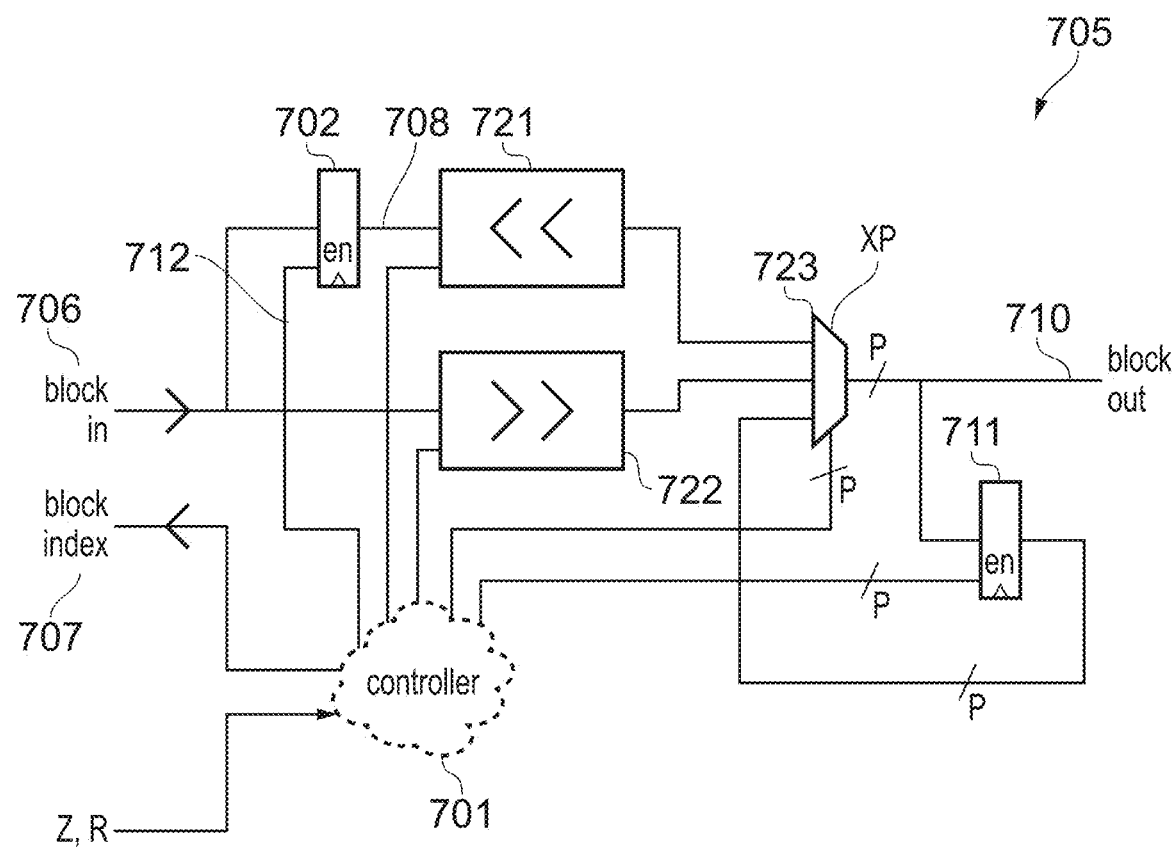
FIG. 7 illustrates a conventional rotator circuit diagram, which suffers from a stalling problem.
Figure 8:
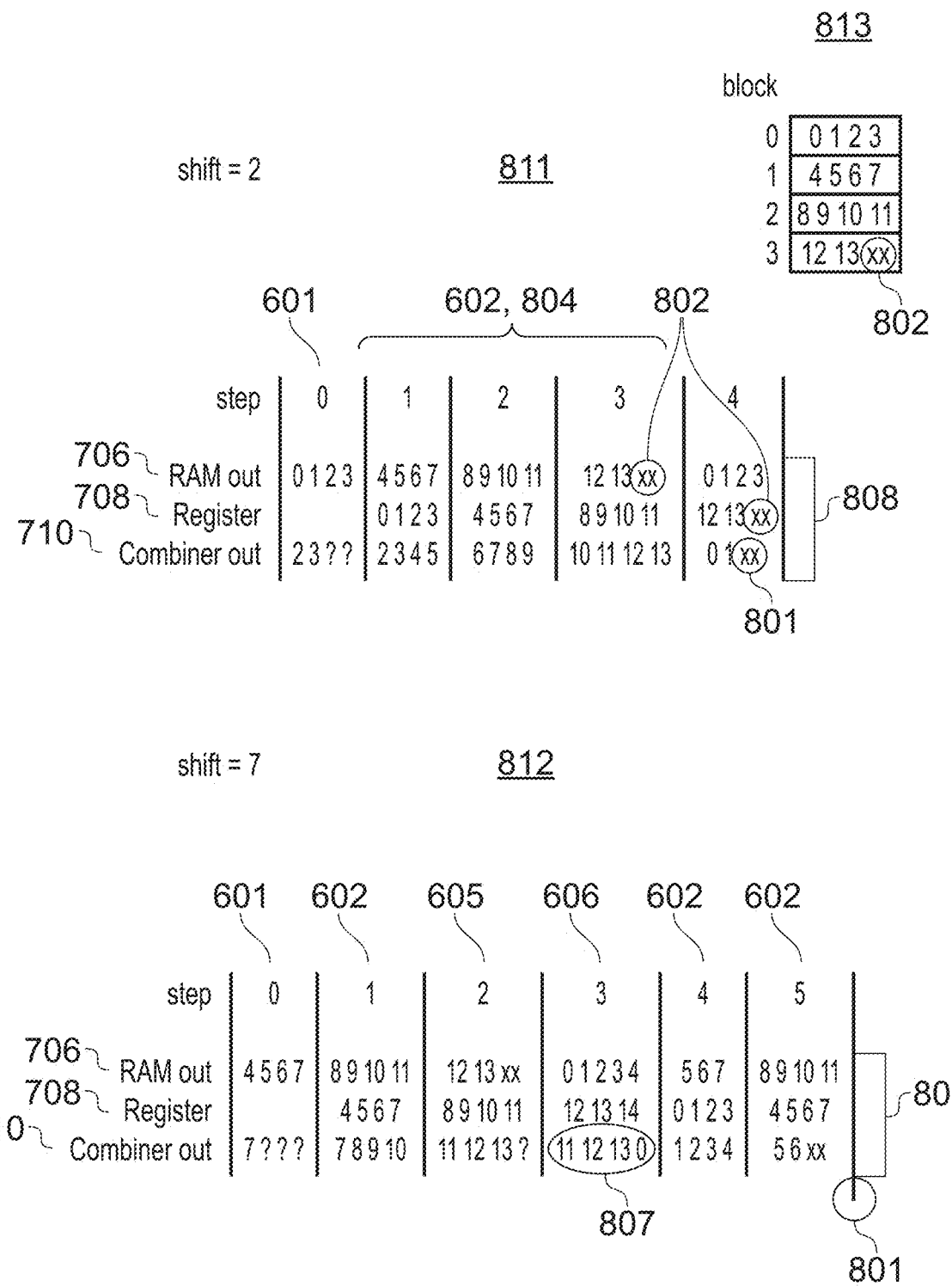
FIG. 8 illustrates the value of various signals in the conventional rotator of FIG. 7 during a series of operations in a benign case where R=2, Z=14, P=4 and no extra operations are required, as well as a case where an extra stalling operation is required when R=7, Z=14, P=4.

FIG. 7 shows a conventional circuit having a parallelism P to implement the rotation function, while FIG. 8 shows operation-by-operation the output from a rotator. The rotator operates over a series of consecutive operations, where each operation may be implemented as one clock cycle, in the case of a Field Programmable Gate Array (FPGA) or Application Specific Integrated Circuit (ASIC) implementation, for example. Alternatively, each operation may be implemented as several clock cycles in the case of a Single Instruction Multiple Data (SIMD) software implementation, for example. For ease of explanation, FIG. 7 and FIG. 8 will be described concurrently. In FIG. 8, Z=14, P=4, and two examples are shown, with the first example 811 having R=2, and the second example 812 having R=7. Here, the values in the table 808 for 706, 708, 710 represent element indices in range 0 to Z−1, rather than literal values. The aim of the rotator is to operate on a set of Z data values. These Z data values are arranged into blocks, where each block contains P data values, which are then referred to as a block of P input values. There are ceil(Z/P) blocks, which comprise a set of blocks. FIG. 8 shows values arranged sequentially in a set of blocks 813. The combiner output 710 of FIG. 8 shows how one rotated block is output per operation, and that the values in the output blocks are equal to the original set of Z data values, but the order in which they are output has been rotated by an amount R. In FIG. 8, the set of Z data values comprises Z=14 values. The rotator can only accept as input 706 one block of P input values per operation.

The set of Z data values are typically arranged in a set of blocks, since this is required by a typical implementation. More specifically, in the RAM, each block is mapped to one address in the RAM, with each address having capacity for P values. Likewise, the CN processor processes P rows in each operation, therefore it requires a block of values input on each operation from each active rotator, and the CN processor writes a block of values to the appropriate RAM during each operation. When the set of blocks are stored in a RAM or similar, the rotator has the output 'block index' 707, which is used to select the block is input to the rotator.

Since mod(Z,P) does not equal zero in the general case, there are some padding values 802 in the last block to complete the P=4 values. These are represented as 'x' in the FIG. 8. When mod(Z,P)>0, it is also the case that there will be some padding values on the output, in order to ensure that all blocks contain P input values.

FIG. 8 shows the function of the conventional rotator on an operation-by-operation basis. Two examples are provided. The first example 811 illustrates a benign case, where the circuit of FIG. 7 can operate without problem. However, the second example 812 illustrates a problematic case, as will be detailed below.

Figure 6:
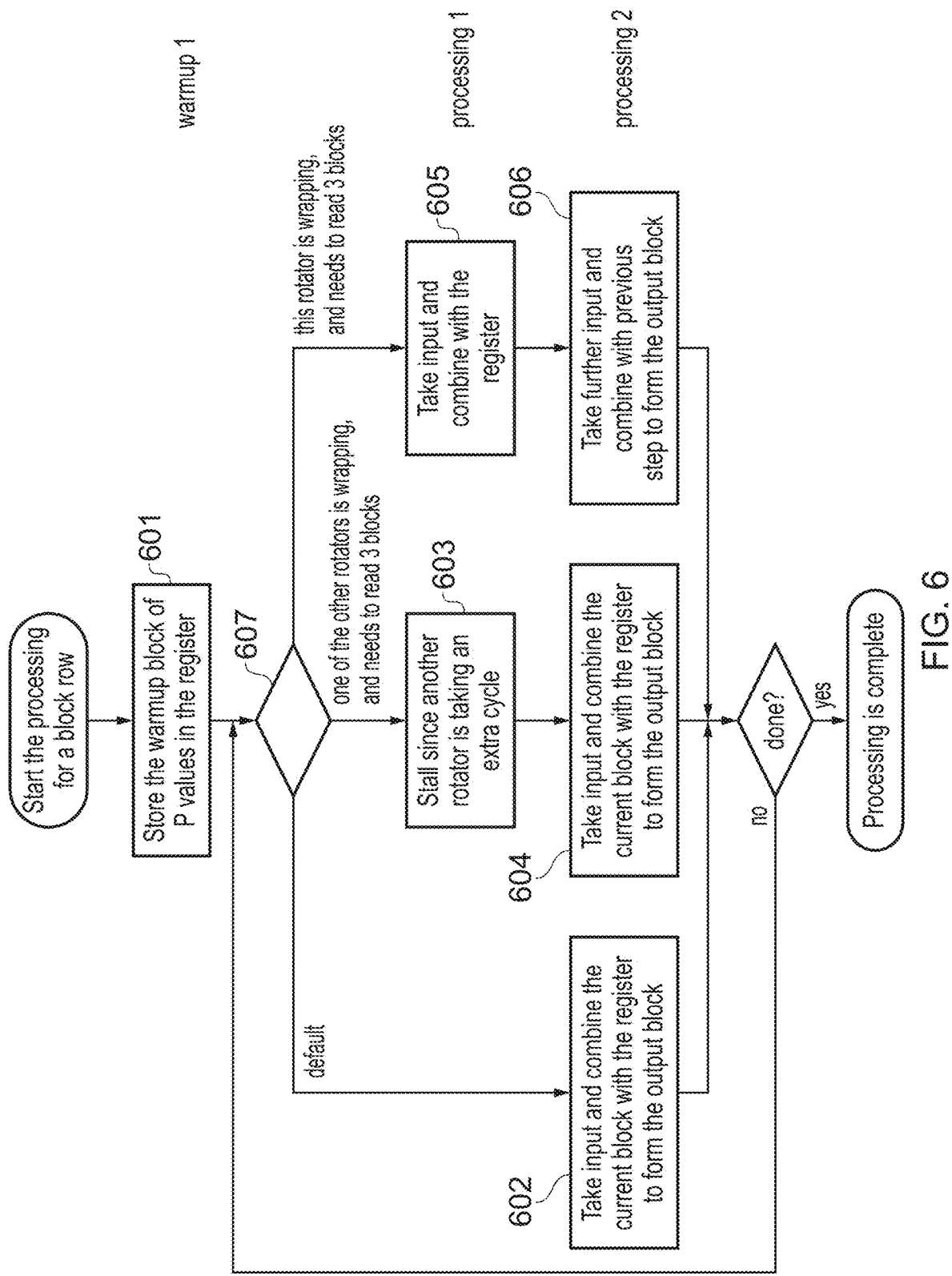
FIG. 6 illustrates a flow chart for the function of a conventional LDPC rotator process.

The benign example 811 of FIG. 8 shows the output blocks from the rotator may comprise values from the set of input blocks that are situated in two different input blocks. Two input blocks over two cycles are required to form the first output and hence the function first starts with a warmup operation 601 during which the first read is completed, as shown in the flowchart of FIG. 6. The first block that is input is the one having the lowest index which contributes to the first block output. Following this, consecutive blocks are input in consecutive clock cycles, wrapping back to the first block following the last block. The register 702 is used to store the first read for the first operation, such that it can be combined with the second read in the second operation, giving the first output. In order to achieve this, register 702 is shifted by a left shift 721, while the blocks input 706 are shifted by a right shift 722. Note that a 'left shift' means the elements are shifted towards the least significant element. A 'right shift' means the elements are shifted towards the most significant element. In other words, a 'left shift' reduces the indices of the shifted elements, while a 'right shift' increases the indices of the shift elements. For example, applying a right shift by 1 position to the string "hello" yields "ohell". It may be observed that when performing a shift, only some of the bits input to the shifter will appear in the output of the shift. A series of P multiplexers 723 are used on each of the P outputs. For each P output, these select whether the output value comes from the right shift or the left shift. For the second output, during the $3^{rd}$ operation, the output can be formed using the register 702, since the rotator is already warmed up, with the register 702 already containing the desired values.

FIG. 8 shows that following the warmup operation 601, the rotator outputs once per operation 804 in this scenario. This scenario is demonstrated by 602 in the flowchart of FIG. 6. Note that in the final operation, the block of P outputs contains two 'x' values 801, which represent padding or 'do not care' values. In the circuit of FIG. 7, these output 'x' values may be populated using shifted values from either the register 708 or the input to the circuit 706. The conventional rotator 705 carries out the flowchart of FIG. 6 under instruction of the controller 701. Note that in some applications, the controller may be embedded within the rotator circuit (e.g., controller 701). In other applications, the controller functions may be merged into a higher-level controller that is external to the rotator circuit, but operably coupled to its internal circuitry.

The problematic second example 812 of FIG. 8 shows that sometimes some parts of the rotation function can take two processing operations 605 and 606, instead of just one 602. This is seen when the output block comprises the combination of three input blocks, which occurs when ((mod(R,P)>mod(Z,P)) and mod(Z,P)>0). This is illustrated in FIG. 8 when Z=7. Here, the output 807 requires LLRs that are situated in three different rows in memory. To address this problematic case, the circuit of FIG. 7 may use a further register 711 to maintain the partial result until the third memory entry is read, and the complete result can be output. This results in a second operation 606 to produce the output 807. In this second operation 606, the P multiplexers 723 for each output now have to select between the right shift 722, the left shift 721, and the values stored in the register 711 on the previous operation.

Figure 9:
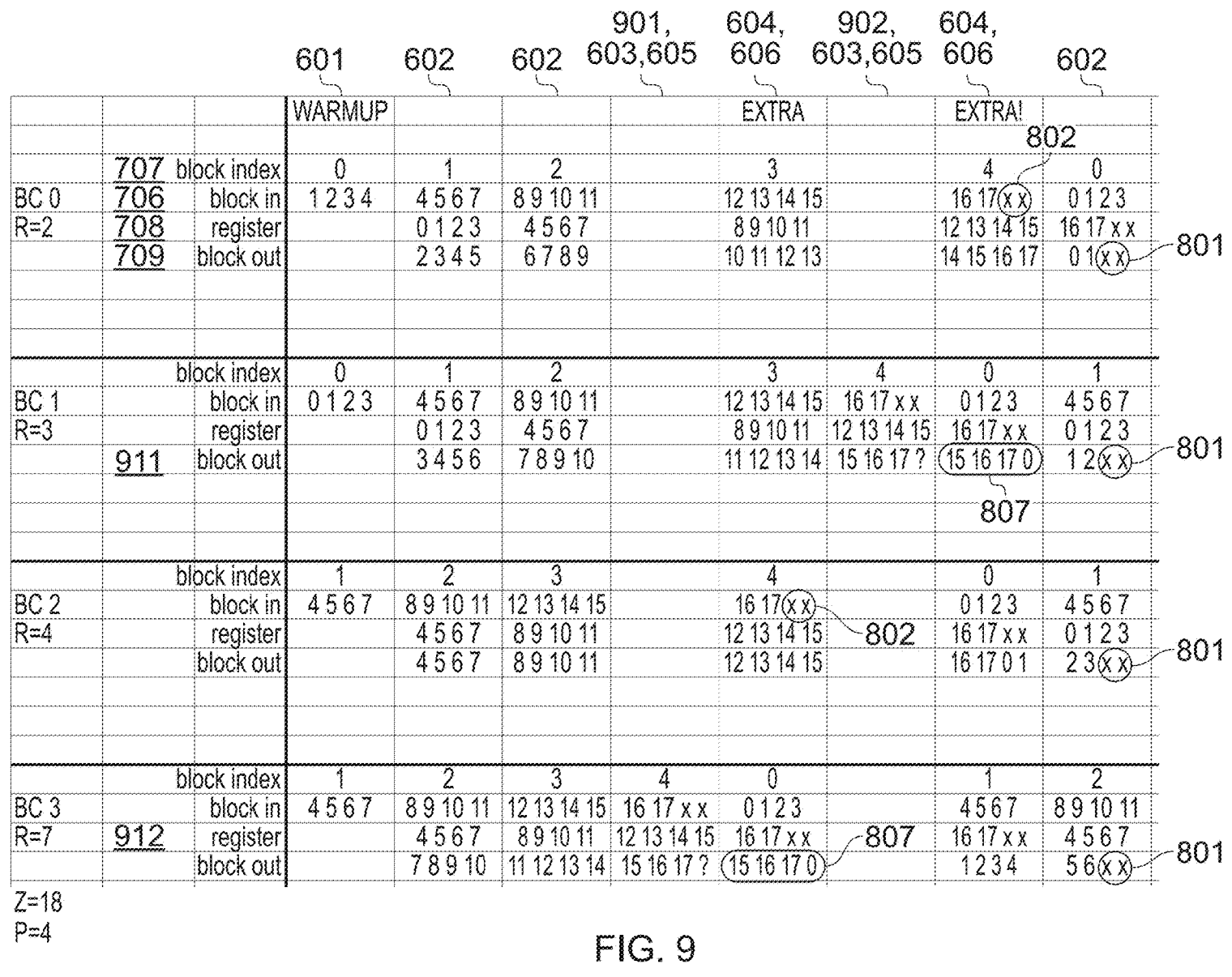

Since multiple block columns of the LDPC are decoded at the same time in a row-parallel LDPC decoder architecture in order to get a high throughput, multiple rotators are processing different block columns at the same time, each with a different rotation value. FIG. 9 shows the function of multiple rotators at the same time. Here, four rotators are shown, each with shifts of 2, 3, 4, 7, respectively. At some point, the rotators performing the rotations of R=3 911 and R=7 912 will require an extra processing operation 606, shown in FIGS. 9 at 901 and 902, respectively. All other rotators must stall at this point 603, in order to ensure that all rotators are producing synchronised outputs, that relate to the same columns in the same operation. During a stall 603, the enable signal 712 is required to maintain the value of the register 702 during the pause operation. More specifically, the rotators each make a decision 607 for each output. If all rotators only need to read two rows, then option 602 is taken. However, if three rows are needed, then options 605 and 606 are undertaken. If one of the other rotators needs to read three rows, then options 603 and 604 are taken. This leads to extra clock cycles for the processing of the block row, and is a deficiency in the conventional design. More specifically, in the worst case, the throughput of the LDPC encoder or decoder may be halved. This will occur if a different rotator needs the extra processing operation 606 for each output block. In a typical case, it is expected that there will be multiple stall cycles 603 when processing a block row, in the case when mod(Z,P)>0. Thus, the inventors have identified and appreciated a need to address or mitigate this identified reduction in throughput of the LDPC encoder or decoder.

In summary, the conventional rotator of FIG. 7 performs a rotation function by a succession of operations on various sets of intermediate values, which include the input values 706 (which then become referred to as the shifting input values for the right shifter 722), the registered values output by the first and second registers 702, 711, the shifting input values 708 for the left shifter, and finally the output values 710.

A First Improved Rotator Circuit that Avoids the Stalling Problem

Examples of the present invention aim to solve or mitigate the stalling problem described in the background section above. In examples of the invention, this may be achieved by ensuring that all rotators produce outputs in a continuous interrupted flow, which therefore maintains synchronisation between parallel rotators operating in different block columns of an LDPC base graph.

Figure 10:
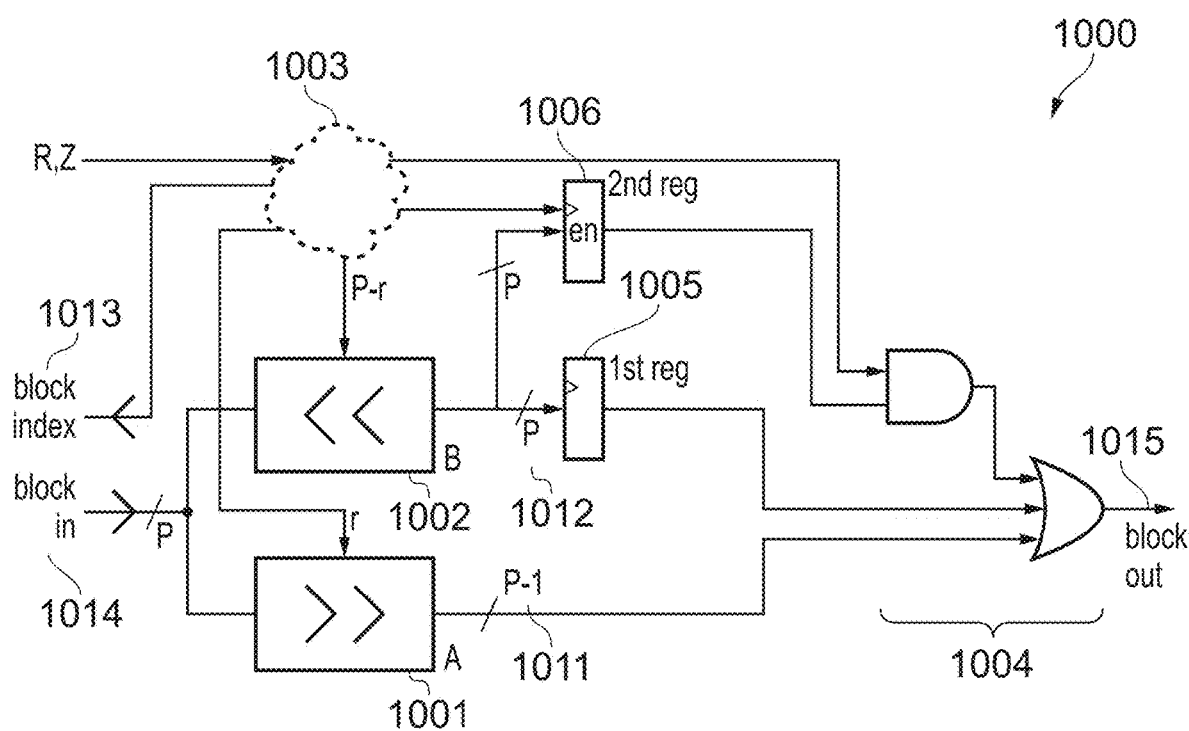
FIG. 10 illustrates a first example circuit diagram of a first improved rotator, which may avoid or mitigate the aforementioned stalling problem, in accordance with some examples of the present invention.

Referring now to FIG. 10, a circuit diagram 1000 of a first improved rotator circuit, which may avoid or mitigate the stalling problem, is illustrated, in accordance with some examples of the present invention. The circuit diagram 1000 comprises shifters 1001 1002, a first register 1005, a second register 1006, a combiner 1004 and a controller 1003. Note that in some applications, the controller may be embedded within the rotator circuit (e.g., controller 1003). In other applications, it is envisaged that the controller functions may be merged into a higher-level controller that is external to the rotator circuit, but operably coupled to its internal circuitry. The shifters both have P elements input to them. One of the shifters 1001 performs right shift functions, while 1002 performs left shift functions. One of these shifters needs P outputs, while the other only requires P−1 outputs. When one shifter is performing a shift of r, the other will be performing a shift of P−r. A skilled practitioner will recognise that the combination of these two shifters may be thought of as one larger shifter that can perform both left and right shifts, having P inputs and 2P−1 outputs. For example, with P=4, the input string 'abcd' can be concatenated with 4 zeros to give '0000abcd', then left shifted by r=3 giving '0abcd000'. The first 4 characters '0abc' is equivalent to the output of right shift 1002 with a shift of P−r=1, while the last 4 characters 'd000' is equivalent to the output of left shift 1001 with a shift of r=3. Note that the final '0' is not used, and the shifter 1001 has P−1 outputs.

The rotator circuit operates over a series of consecutive operations, where each operation may be implemented as one clock cycle, in the case of a Field Programmable Gate Array (FPGA) or Application Specific Integrated Circuit (ASIC) implementation, for example. Alternatively, each operation may be implemented as several clock cycles in the case of a Single Instruction Multiple Data (SIMD) software implementation, for example. The input to the rotator circuit accepts one block per operation 1014, and the rotator circuit may have an output indicating the index of the block it requires in each operation 1013. The first register 1005 stores the output of the left shifter 1002 from the previous operation. This is required when the rotation value is such that the required output block spans two input blocks. This first register performs the same function as the first register of 702. Since this first register 1005 contains only the previous value of the shifter 1002, no enable signal is required to instruct the register to hold a value for multiple operations. This is in contrast to the conventional implementation, where register 702 has the enable 712, since the conventional rotator needs to pause when other rotators are taking an extra operation to form the output 1015.

The second register 1006 stores a shifted copy of the first block. This register is loaded at the start of processing, and the left shift function is performed by a left shifting circuit 1002. This left shift depends on the overall rotation R. Since the value in this register is maintained for the entire rotation function, an enable signal is required. This second register has a width of P elements.

The combiner 1004 takes the output from the right shift 1001, the output from the first register 1005 and the output from the second register 1006, where it produces the output block. Each output block is always the combination of at least the right shift and the first register. These can simply be 'OR'ed together, if the shifters fill empty positions with zero values. If the shifters 1001 1002 do not fill empty positions with zeros, then for each of the P output values, the combiner 1004 will have to multiplex between the options 1005, 1011. Sometimes the value of the second register will required. When this is the case, the 'AND' logic gate allows the second register to also be 'OR'ed into the output 1015, if the shifters 1001 1002 fill empty positions with zero values. Here, the 'AND' gate performs a masking function, which outputs the registered values of the second register when the masking is disabled or outputs dummy values equal to binary zeros when the masking function is enabled. If empty positions are not zero valued, then for each of the P output values the combiner 1004 will have to multiplex between the options 1005, 1011 and 1006.

Figure 11:
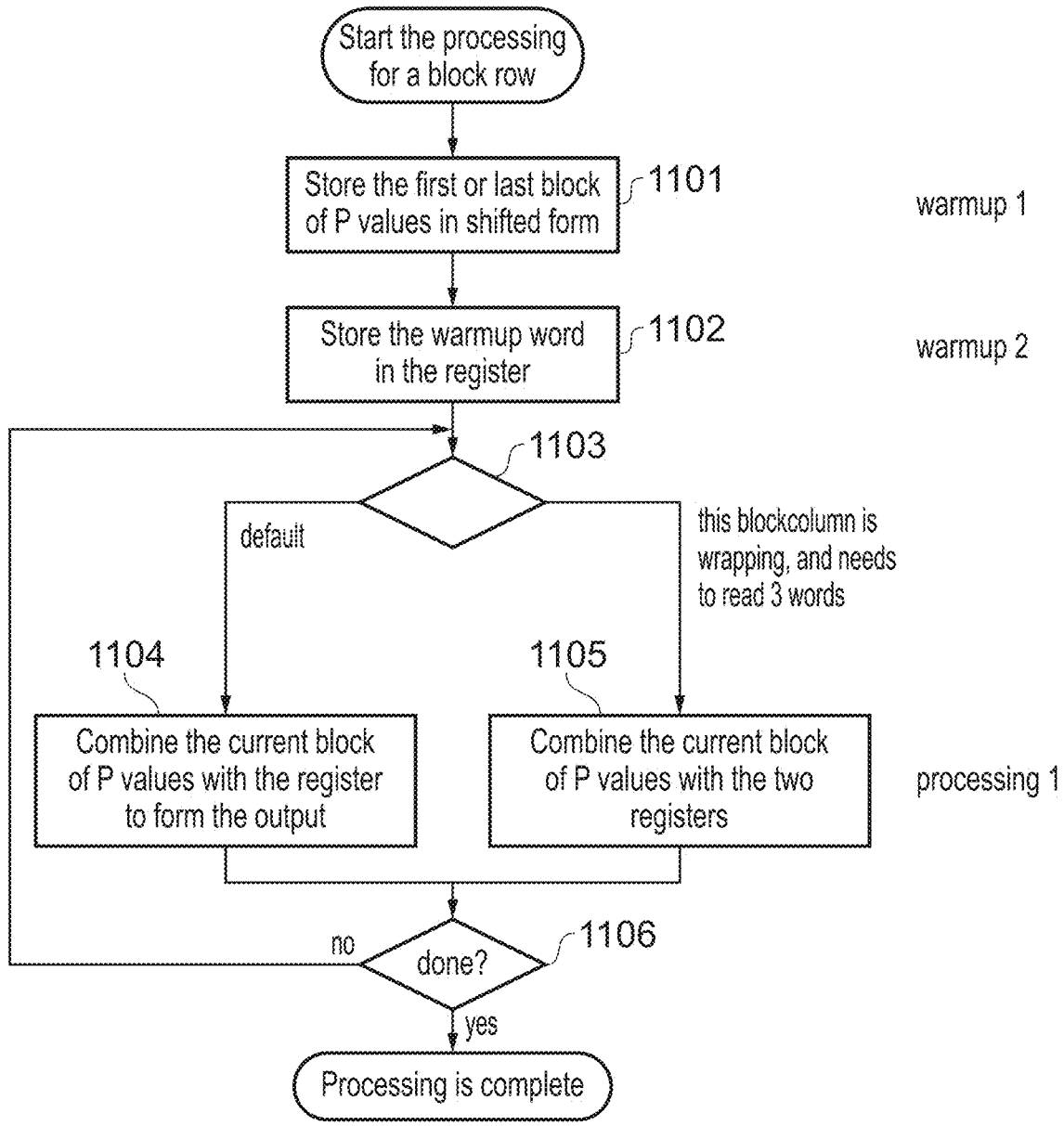
FIG. 11 illustrates one exemplary flow chart for the function of the first improved rotator of FIG. 10, in accordance with some examples of the present invention.

The flowchart of FIG. 11 shows the flow that comprises the rotator function. In the first operation 1101, the first row from the memory is loaded into the second register 1006, following a shift applied by a left shifting circuit 1002. In the following operation 1102, the register 1005 takes a value which has been shifted by the left shifting circuit 1002. This is the warmup for the first output, which may span two rows from the memory. Until the end, the rotator circuit now outputs on every operation. For each operation, the rotator circuit needs to decide 1103 whether to operate in mode 1104 or 1105. In 1105 mode, when the output is formed of three RAM rows, the output from shifter 1001, register 1005 and 1006. Otherwise, in 1104 mode, the output is formed of a combination of register 1005 and shifter 1001. When all the processing for this block row has completed 1106, the rotator circuit is ready to process the next block row.

Figure 12:
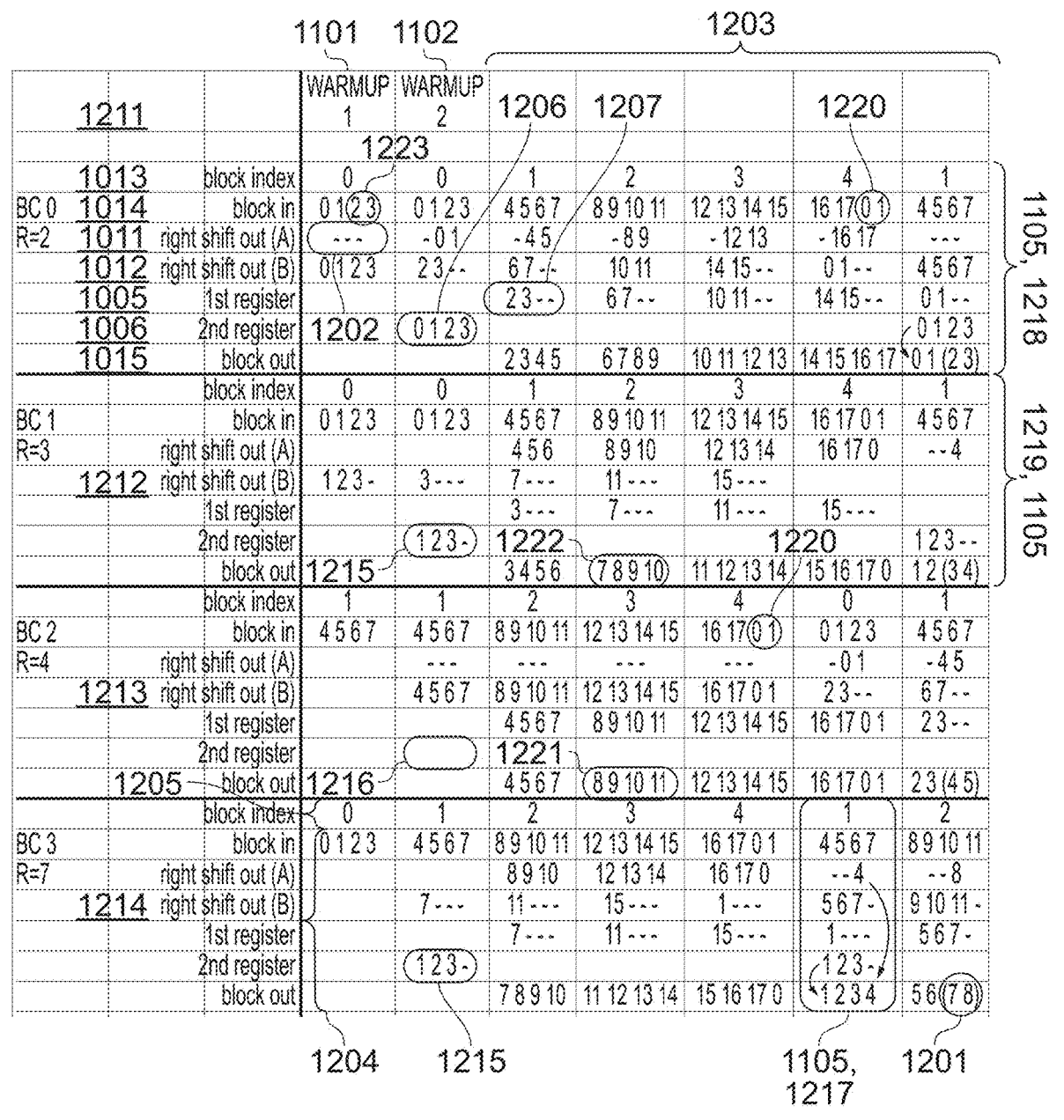

FIG. 12 shows the parallel function of four instances of the novel rotator circuits. In a typical row-parallel LDPC decoder, many of these will be operating in parallel, but only four are shown here. The four rotator circuits need to perform shifts of 2, 3, 4 and 7, respectively. In this example, Z=18, and P=4. In FIG. 12, the signals first register, second register, A, B, out each convey the element index 1204 in the range 0 to Z−1, rather than the literal value. The values for block index 1205 are literal values. '-' values 1202 are empty values, which are equal to '0'. These arise from the shifters which pad with zeros where necessary. FIG. 12 uses '-' to represent these zeros to avoid confusion between values of index '0'.

The first two operations are warmup operations 1101 and 1102. Here, no output is generated. Instead, first 1005 and second register 1006 are loaded in turn. In this example, the second register 1006 is loaded first 1206. For BC 0 1211, the second register 1006 is loaded with no left shift applied. For BC 1 1212 and BC 3 1214, the second register 1006 is loaded with a left shift of 1 applied 1215. For BC 2 1213, the value of the second register is not needed during the rotation function, so in this example it is not loaded with any value 1216.

In the following warmup operation 1102, the first register 1207 is loaded following a left shift. BC 0 has a left shift of 2; BC 1 and BC 3 have a left shift of 3, while BC2 has a left shift of 0.

From this point onwards, the output can be generated continuously 1203. Most of the time, the decision element 1103 selects option 1104, where the output 1015 is formed using the first register 1005 and the right shift 1011. An example of this is output block 1222.

When the output block is comprised of the first input block and optionally the second input block, the decision element 1103 selects option 1105. Now, the output is formed using the first register 1005, second register 1006 and the right shift 1011. This is done for BC 0 1218, BC 1 1219 and BC 2 1217. This option 1105 is required since on the previous operation, the first input block was not read, since we instead read the last input block.

Unlike the conventional rotator of FIG. 7, the novel rotator circuit of FIG. 10 requires one operation to output each block. This means that no stall functions are required at any point during the block row processing, leading to an overall reduction in the number of operations for processing each block row. This aims to solve the problem in the conventional design, where potentially every other operation could be a 'stall'. The novel rotator therefore allows for an improvement in throughput of up to double the throughput achievable by the conventional rotator, when applied to a row-parallel LDPC decoder. Note that while discussion here has focused on the application to row-parallel LDPC decoders, it is envisaged that the novel rotator circuit may be readily applied to other implementations such as block-parallel LDPC decoders. This is because all implementations will have to undertake rotation over sets of Z data values, irrespective of the order calculations are undertaken by different algorithms. Furthermore, in order to achieve high throughputs, other algorithms will have to process multiple values per operation (leading to P>1), and will have to support all different possible values of Z (leading to mod(Z,P)>0).

The set of blocks will always contain a number of input values that is a multiple of P, however Z may not be a multiple of P. In this case, P-mod(Z,P) padding values are required. The scheme of FIG. 10 positions these padding values in the final block 1220, in the last positions. Furthermore, the padding values 1220 are a repeat of the first P-mod(Z,P) elements from the first block 1223.

In the final output block, since Z is not a multiple of P, there will be some padding values to produce a full block of P. In the novel rotator circuit, these P-mod(Z,P) padding values are equal to the first P-mod(Z,P) values output as part of the first block. This repetition is shown in FIG. 12 by parenthesis 1201. This repetition is beneficial when the output from the rotator circuit is further processed by further rotation functions. More specifically, the set of blocks may be written back to the core VM memories 503. The repetition in the final output block 1201 will also be written to these memories. During the processing of following block rows, the set of blocks will be input to a rotator circuit for further processing. The output repetition 1201 will therefore become the input repetition 1220, which is required for correct function of subsequent activations of the rotator circuit.

It may be observed that even when R is not a multiple of P, some blocks of P input values provided at the input to the rotator circuit may not require any shifting and may appear replicated directly in the output of the rotator circuit, albeit in a different position in the sequence of blocks. This can occur when mod(R,P) is equal to mod(Z,P), for example. On FIG. 12, 1221 shows this case, where the output block comes directly from the first register 1005, while the output from the right shift 1011 does not contribute to the output block since it is all zero.

A skilled practitioner could recognise that given the circular nature of the data, the ordering of the blocks could be rotated before being input, and the function of the rotator circuit would only have to consider the changes in the block index. This means that a scheme where the padding values are instead inserted into a block of P input values in the middle of the sequence of Z elements can be handled in the same way as discussed for this novel rotator circuit. Similarly, a skilled practitioner could recognise that the padding values could be inserted at the start of a block of P input values, rather than at the end.

A skilled practitioner could recognise that the arrangement of the registers and shifters can be readily rearranged to give the same functionality. For example, moving the left shift 1002 after the registers 1005 and 1006 gives the same functionality, albeit with two instances of the left shift. Control signals would also have to be modified since the left shift would be doing the same functions, but these will be delayed by an operation.

Note that when Z<P, a skilled practitioner would recognise that the novel rotator circuit 1000 could be configured to take all Z data values as input, perform the required rotation and output all Z data values in the desired rotated order within a single operation. Furthermore, in the case where Z is a multiple of P and hence no padding values are used, a skilled practitioner would recognise that the novel rotator circuit 1000 could be configured to eliminate the first warmup operation where the second register is written and instead complete the complete rotation function using Z/P+1 operations and only the first register.

In summary, the first improved rotator circuit of FIG. 10 performs a rotation function by a succession of operations on various sets of intermediate values, which include the input values 1014 (which then become referred to as the shifting input values), the shifting output values 1011 and 1012, the registered values output by the first register 1005 and the second register 1006, and finally the output values 1015. FIG. 10 provides a first example of how the registered values and shifting output values are derived from the input values.

A Second Improved Rotator Circuit that Avoids the Stalling Problem

Figure 13:
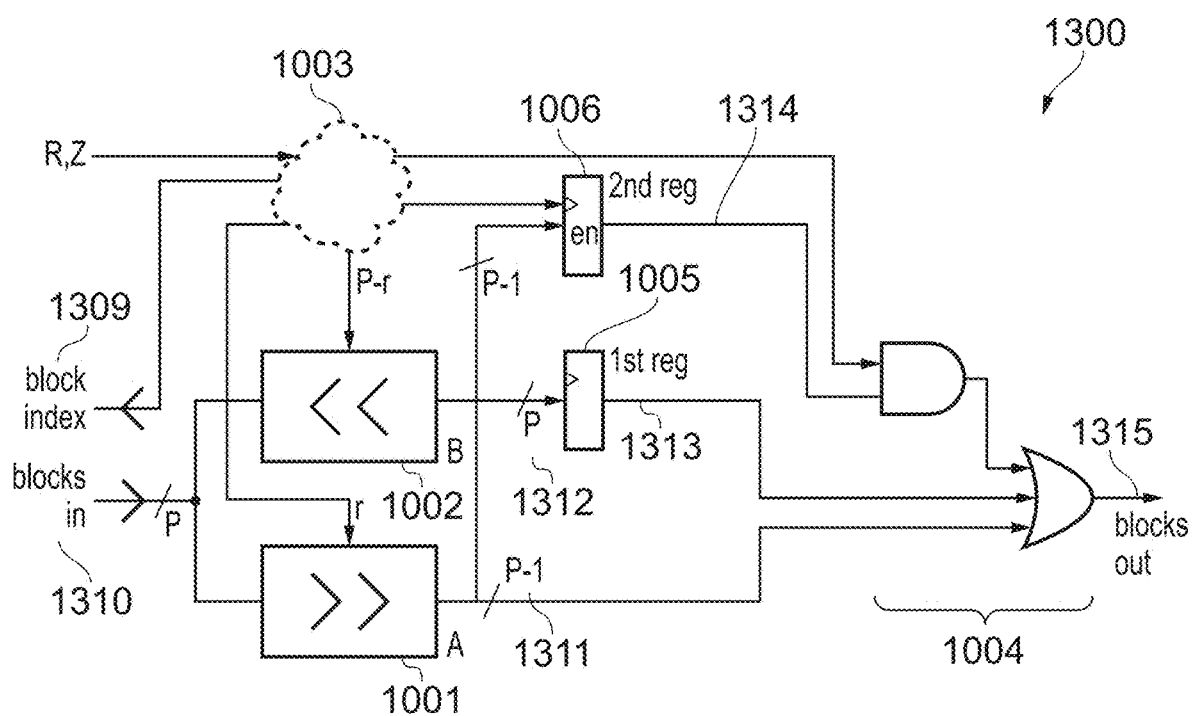
FIG. 13 illustrates a second example circuit diagram of a second improved rotator, which may avoid or mitigate the aforementioned stalling problem, in accordance with some examples of the present invention.

Referring now to FIG. 13, a circuit diagram of a second improved rotator circuit 1300, which may avoid or mitigate the stalling problem is illustrated, in accordance with some examples of the present invention. A key difference to the previous rotator circuit of FIG. 10 is that the second register 1006 of FIG. 13 stores a copy of the last block, while the second register 1006 of FIG. 10 stores a copy of the first block. Additionally, the second register 1006 connects to the right shift 1001, while the second register 1006 of FIG. 10 connects to the left shift 1002. This rotator circuit 1300 also accepts one block per operation on its input 1310, and can indicate which block it wants as input during each operation on output 1309.

FIG. 14 shows the function of 4 instances of this novel rotator design. As before, the first operation is to load the second register 1006, using the right shifter 1001 to apply some shift amount before storing in the register. The amount it is shifted by depends on the rotation R. Note that the second register is only P-1 values wide, and the lowest index value after shifting is not stored. FIG. 14 shows the values of the following wires: 1309, 1310, 1311, 1312, 1313, 1314, 1315, which correspond to the schematic of FIG. 13.

In this scheme, the padding values are located at the end of the last block 1401. In the scheme of FIG. 10 it was required for these P-mod(Z,P) padding values to be equal to the first P-mod(Z,P) values of the first block, known as repetition. For the scheme of FIG. 13, these padding values 1401 can either take the value of the first P-mod(Z,P) values of the first block, or be equal to zero. In FIG. 14 these padding values are shown as 'x', indicating they should be a value that will not contribute to any of the output blocks. 1402 shows the position of these padding values once passed through the right shift 1001, and stored by the second register 1006. Nonetheless, the final P-mod(Z,P) values in the final block 1403 of the examples of FIG. 14 are a repeat of the first P-mod(Z,P) values from the first block 1404. This means the output blocks from one rotator activation can be passed as input blocks for another rotator activation, if the repetition scheme is used for padding values.

The flowchart of FIG. 11 also applies to this scheme 1300. During warmup operation 1 1101, the last block is stored in the second register in shifted form. The warmup operation 2 1102 follows. When the decision element 1103 chooses 1104, the output block is formed by the combiner 1004 from the output of the right shift 1311 and the first register 1313. This function is the same as for scheme 1000.

On a given output, if the block required to load the first register differs from the block required by the right shifter, then the decision element 1103 of FIG. 11 chooses 1105 instead. This occurs for BC 0 at 1411, BC 1 at 1412, and BC 3 at 1414. In 1105, since the rotator wants to access three blocks at once, the second register is used to form the output. In 1105, the output block is constructed by the combiner 1004, which uses the second register output 1314, the first register output 1313 and the right shift output 1311. The second register of 1300 fulfils the same function as the second register of 1000, however the operation in which the second register is used differs between 1000 and 1300.

The advantage of 1300 is that it accepts padding values having zero values 1401. Meanwhile, 1000 requires the padding values to be the repeat of the first P-mod(Z,P) values. The disadvantage of 1300 is that is requires the last block as the first input, which may not be available as early as the first block, as required by 1000. The advantage of novel rotator circuit 1300 compared to the conventional rotator is that there is an output on each operation 1203 after the warmup operations 1101 1102, hence solving the stalling problem described in the background section above As with the scheme 1000, a skilled practitioner can observe that this scheme 1300 can also readily rearrange the order of the shifter 1001 and register 1006, or rearrange the shifter 1002 and register 1005, with the resulting functionality being identical.

As with the scheme 1000, a skilled practitioner can observe that this scheme 1300 also has a cyclic property, which means the scheme 1300 can be readily modified to move the padded input block to a position other than the last.

A skilled practitioner could recognise that if the padding values were located at the start of a block, instead of the end of a block as described for this scheme 1300, then the design could be readily rearranged to accommodate this. More specifically, if the padding values are zeros, they will not contribute any output block. The non-padding values in the padded input block (i.e., the input block containing padding values) will still need to be positioned correctly, therefore the amount of shift performed by the right shift 1001 of 1300 will need adjusting during the warmup operation 1101.

Note that when Z<P, a skilled practitioner would recognise that the novel rotator circuit 1300 could be configured to take all Z data values as input, perform the required rotation and output all Z data values in the desired rotated order within a single operation. Furthermore, in the case where Z is a multiple of P and hence no padding values are used, a skilled practitioner would recognise that the novel rotator circuit 1300 could be configured to eliminate the first warmup operation where the second register is written and instead complete the complete rotation function using Z/P+1 operations and only the first register.

In summary, the second improved rotator circuit of FIG. 13 performs a rotation function by a succession of operations on various sets of intermediate values, which include the input values 1310 (which then become referred to as the shifting input values), the shifting output values 1311 and 1312, the registered values output by the first register 1005 and the second register 1006, and finally the output values 1315. FIG. 13 provides a second example of how the registered values and shifting output values are derived from the input values.

A Third Improved Rotator Circuit that Avoids the Stalling Problem and Enables the Pipelined Processing of Block Rows The novel rotator circuits 1000 and 1300 of FIG. 10 and FIG. 13 benefit from requiring only a small number of components, but they prevent the tight pipelining of processing successive block rows. More specifically, these designs require a total of ceil(Z/P)+2 operations from the start to the end of processing each block row and they take inputs during all ceil(Z/P)+2 of these operations, while they generate outputs during the last ceil(Z/P) of these operations 1203. However, the average number of operations required to process a block row could be reduced to ceil(Z/P), if it was possible to perform the final two operations in the ceil(Z/P)+2 operations of a first block row simultaneously with the first two operations 1101 and 1102 in the ceil(Z/P)+2 operations of a second successive block row, in an overlapped pipelined manner. However, this is prevented in the rotator circuit designs 1000 and 1300 of FIG. 10 and FIG. 13. This is because, while only the first block row generates outputs during these two operations, both block rows take inputs during these two operations, which prevents pipelining since only one input can be taken per operation in a pipelined implementation. Hence, the novel rotator circuits of FIG. 10 and FIG. 13 do not enable pipelining and use an average of ceil(Z/P)+2 operations per block row.

Figure 15:
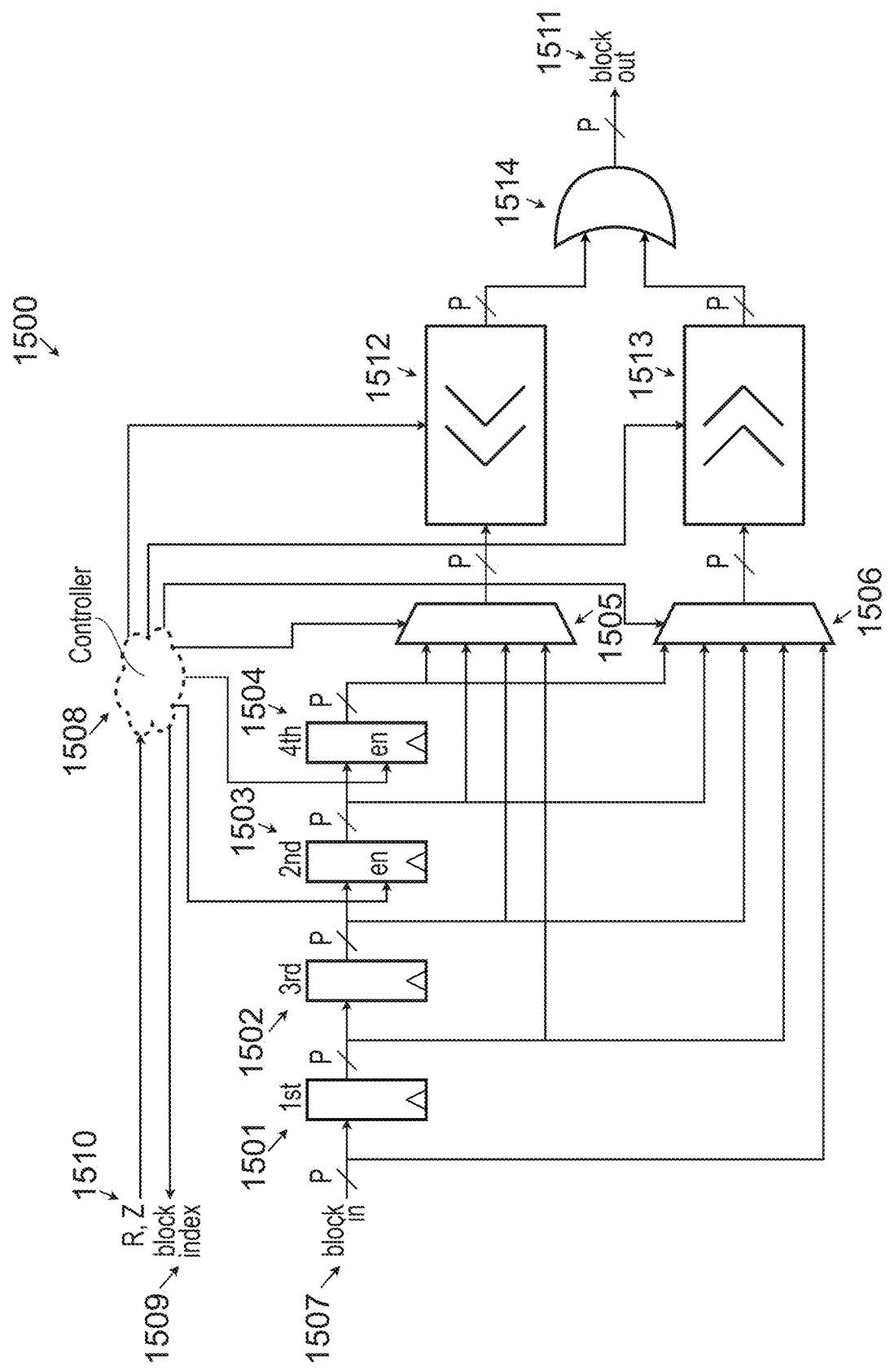
FIG. 15 illustrates a third example circuit diagram of a third improved rotator, which may avoid or mitigate the aforementioned stalling problem and enables the pipelined processing of block rows, in accordance with some examples of the present invention.

The novel rotator 1500 of FIG. 15 is designed to enable tight pipelining, at the cost of requiring more components than the novel rotator circuits 1000 and 1300 of FIG. 10 and FIG. 13. Like these previous designs, the novel rotator circuit 1500 of FIG. 15 requires a total of ceil(Z/P)+2 operations from the start to the end of processing each block row. However, the design of FIG. 15 takes inputs during only the first ceil(Z/P) of these operations, and it generates outputs during the only last ceil(Z/P) of these operations. When processing two successive block rows, the final two operations in the ceil(Z/P)+2 operations of the first block row can be performed simultaneously with the first two operations in the ceil(Z/P)+2 operations of the second block row. This is possible because only the first block row generates outputs during these two operations and only the second block row takes inputs during these two operations. Hence, the novel rotator circuit 1500 of FIG. 15 enables a tight pipelining, which uses an average of ceil(Z/P) operations per block row. Furthermore, the novel rotator circuit 1500 of FIG. 15 achieves this without any stalling, hence solving the stalling problem exhibited by the conventional rotator of FIG. 7. Note that as in the novel rotator circuits 1000 and 1300 of FIG. 10 and FIG. 13, each operation in the function of the novel rotator circuit 1500 may be implemented as one clock cycle, in the case of a Field Programmable Gate Array (FPGA) or Application Specific Integrated Circuit (ASIC) implementation, for example. Alternatively, each operation may be implemented as several clock cycles in the case of a Single Instruction Multiple Data (SIMD) software implementation, for example.

The novel rotator circuit 1500 of FIG. 15 is operated under the direction of a controller 1508, depending on the values of R and Z provided as an input 1510 to the rotator in advance of performing a rotation function upon a particular block column within a block row. Note that in some applications, it is envisaged that the controller may be embedded within the rotator circuit (e.g., controller 1508). In other applications, the controller functions may be merged into a higher-level controller that is external to the rotator circuit, but operably coupled to its internal circuitry. In each operation during the function of the rotator circuit 1500, the controller 1508 can request the input of a particular block of values, using the block index output 1509. Here, the index may adopt a value in the range 0 to ceil(Z/P)−1. The rotator circuit 1500 then expects the corresponding block comprising P input values to be provided at the input 1507 during that operation. In each operation, the rotator circuit 1500 may provide an output 1511 comprising P output values, which are rotated according to R. Each value in the input 1507 and output 1511 may represent one bit or one soft-valued bit such as an LLR, when adopted in an LDPC encoder and decoder, respectively.

The input 1507 in each operation is provided to a shift register, which comprises a series of four registers 1501, 1502, 1503 and 1504. The first pair of registers 1501 and 1502 serve a similar purpose to the first register 1005 in the novel rotator circuits 1000 and 1300 of FIG. 10 and FIG. 13. Likewise, the second pair of registers 1503 and 1504 serves a similar purpose to the second register 1006 in the novel rotator circuits 1000 and 1300 of FIG. 10 and FIG. 13. Accordingly, the two registers in the first pair are referred to as the first register 1501 and the third register 1502, while the two registers in the second pair are referred to as the second register 1503 and the fourth register 1504. Like the second register 1006 in the novel rotator circuits 1000 and 1300 of FIG. 10 and FIG. 13, the second pair of registers 1503 and 1504 have enable signals, which grants the controller 1508 the ability to enable or disable the writing of the second pair of registers 1503 and 1504 on an operation-by-operation basis. A first multiplexer 1505 allows the selection of a block of P shifting input values from among the outputs of the four registers 1501, 1502, 1503 and 1504. A second multiplexer 1506 allows the selection of a block of P shifting input values from among the input to the rotator 1507 and the outputs of the four registers 1501, 1502, 1503 and 1504. The multiplexers 1505 and 1506 operate under the direction of the controller 1508, which ensures that all values required for the output 1511 in the current operation are present among the outputs of the multiplexers. The output of the first multiplexer 1505 is left shifted by a left shifter 1512, while the output of the second multiplexer 1506 is right shifted by a right shifter 1513. The number of positions by which the values output by the multiplexers 1515 and 1516 are shifted by the shifters 1512 and 1513 is directed by the controller 1508, as required to correctly position the values for the output 1511. In the case where the left and right-shifters 1512 and 1513 shift zero-values into the blocks of P shifting output values, then their outputs may be combined by an OR gate 1514, in order to produce the output 1511 of the rotator 1500 in each operation. Note that if the left and right-shifters 1512 and 1513 shift some other values into the blocks of P shifting output values, then the OR gate 1514 can be replaced with a generic combiner circuit, which multiplexes the values accordingly.

In the case where Z is not divisible by P i.e. mod(Z,P)>0 and when the block having the index ceil(Z/P)−1 is requested 1509, it is assumed that the block of P input values 1507 comprises the last mod(Z,P) values in the series of Z data values, followed by P-mod(Z,P) padding values. Further, it is assumed that these padding values are repetitions of the first P-mod(Z,P) values in the series of Z data values. In this case, the novel rotator circuit 1500 is always able to generate the required rotated output blocks 1511, including repeated padding output values, for any values of Z and R.

Figure 16:
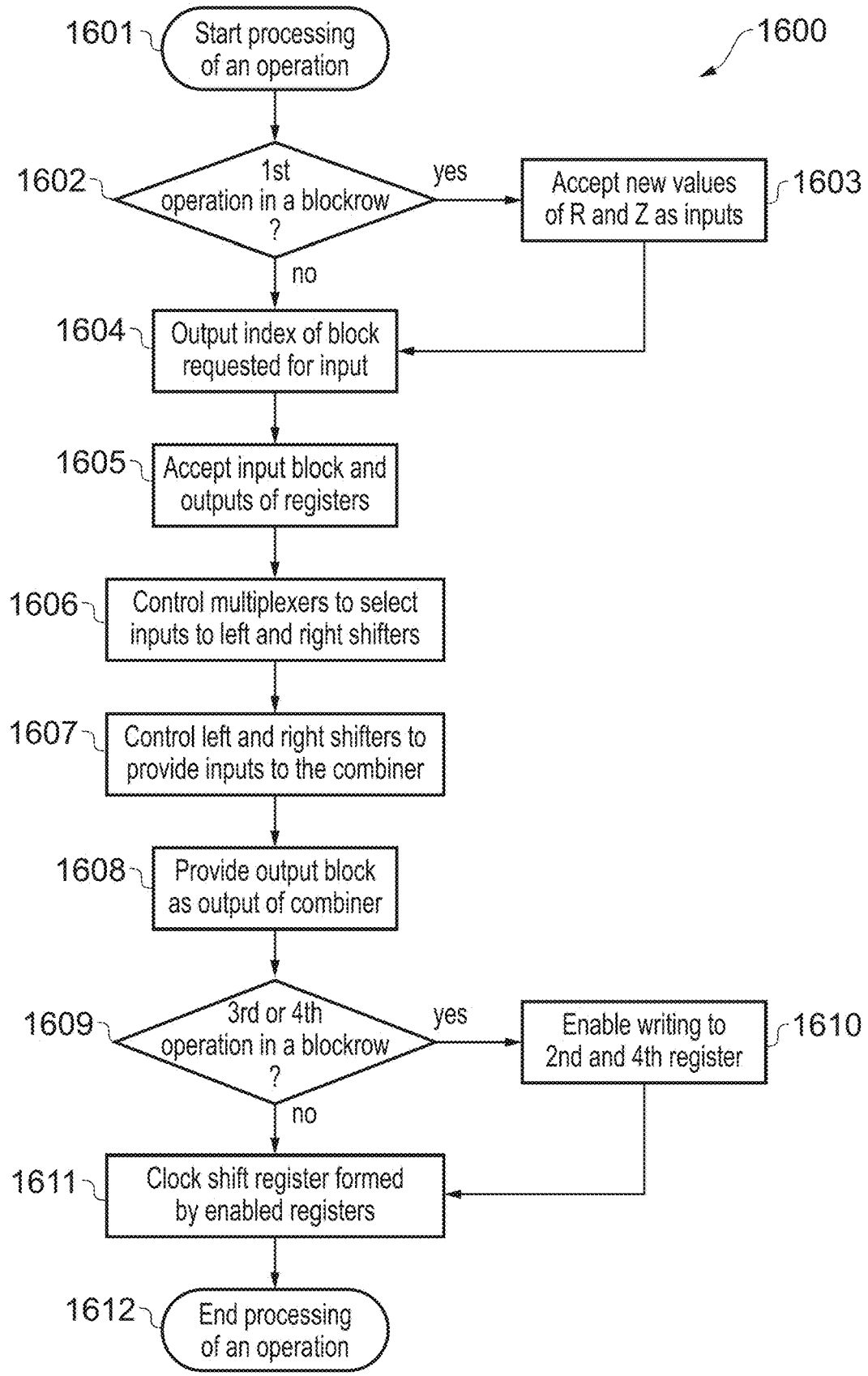
FIG. 16 illustrates one exemplary flow chart for the function of the third improved rotator of FIG. 15, in accordance with some examples of the present invention.

The function of the novel rotator circuit 1500 in each operation is summarised in the flowchart 1600 of FIG. 16. At the start of each operation 1601, the controller 1508 determines if this is the first operation in the processing of a new block row 1602. If so, then new values of R and Z are accepted as inputs 1603 using the input 1510. Following this, the controller 1508 outputs the index of the block requested for input 1604, using the output 1509. Next 1605, a block comprising P input values is accepted from the input 1507, as well as a block of P registered values from the outputs of the registers 1501, 1502, 1503 and 1504. The controller 1606 then directs 1606 the multiplexers 1505 and 1506 to select blocks of P shifting input values to provide to the left shifter 1512 and right shifter 1513. Next 1607, the controller 1606 directs the left shifter 1512 and right shifter 1513 to provide inputs to the combiner 1514. Then 1608, the output of the combiner 1514 is provided to the output 1511. If and only if the controller 1508 determines 1609 that this is the 3rd or 4th operation in the processing of a block row, then the enable signals for the second pair of registers 1503 and 1504 are asserted 1610. Then 1611, the shift register formed by the registers 1501, 1502, 1503 and 1504 are clocked 1611. This then completes the processing of the operation 1612.

Figure 17:
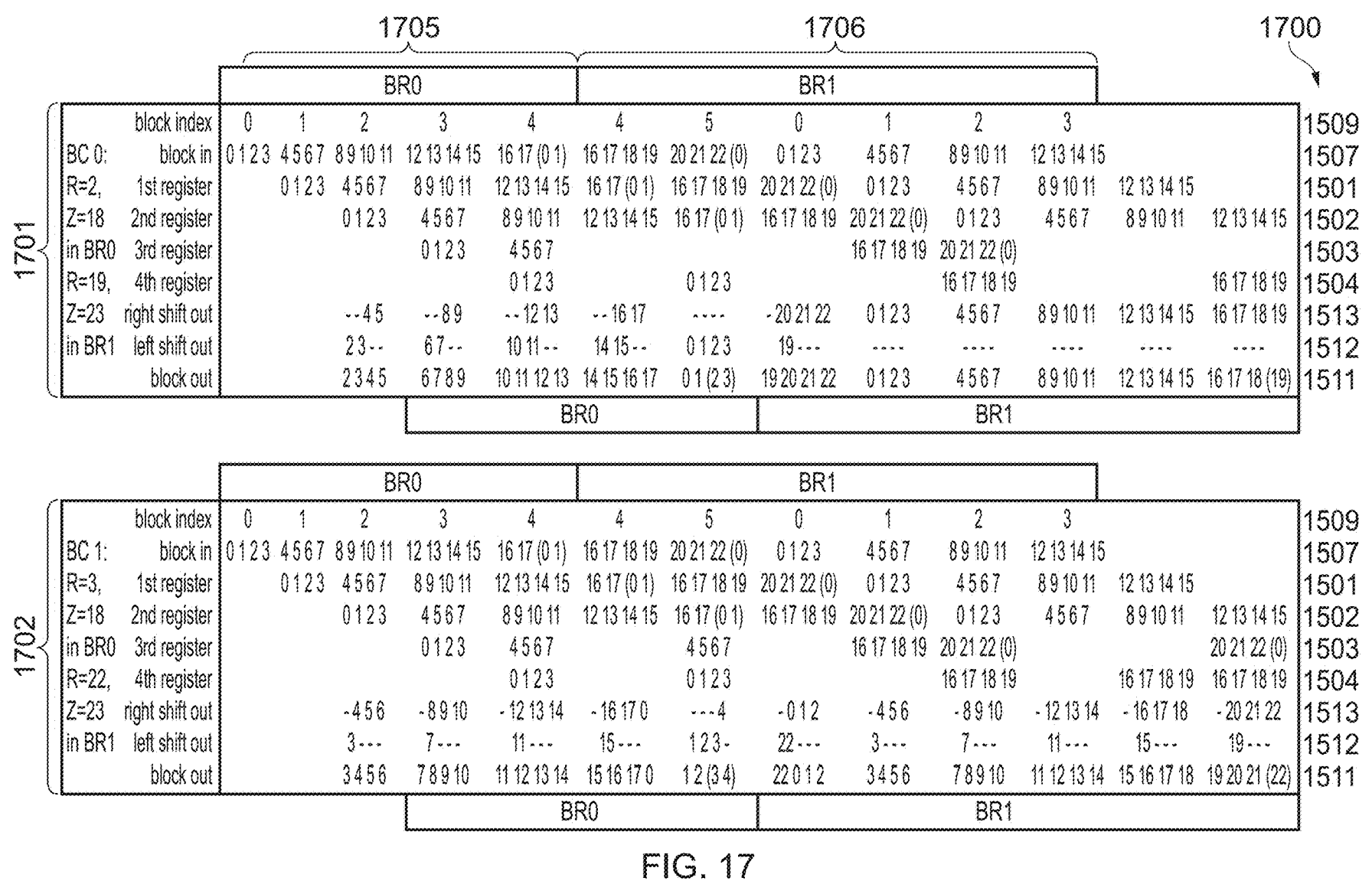
Figure 17:
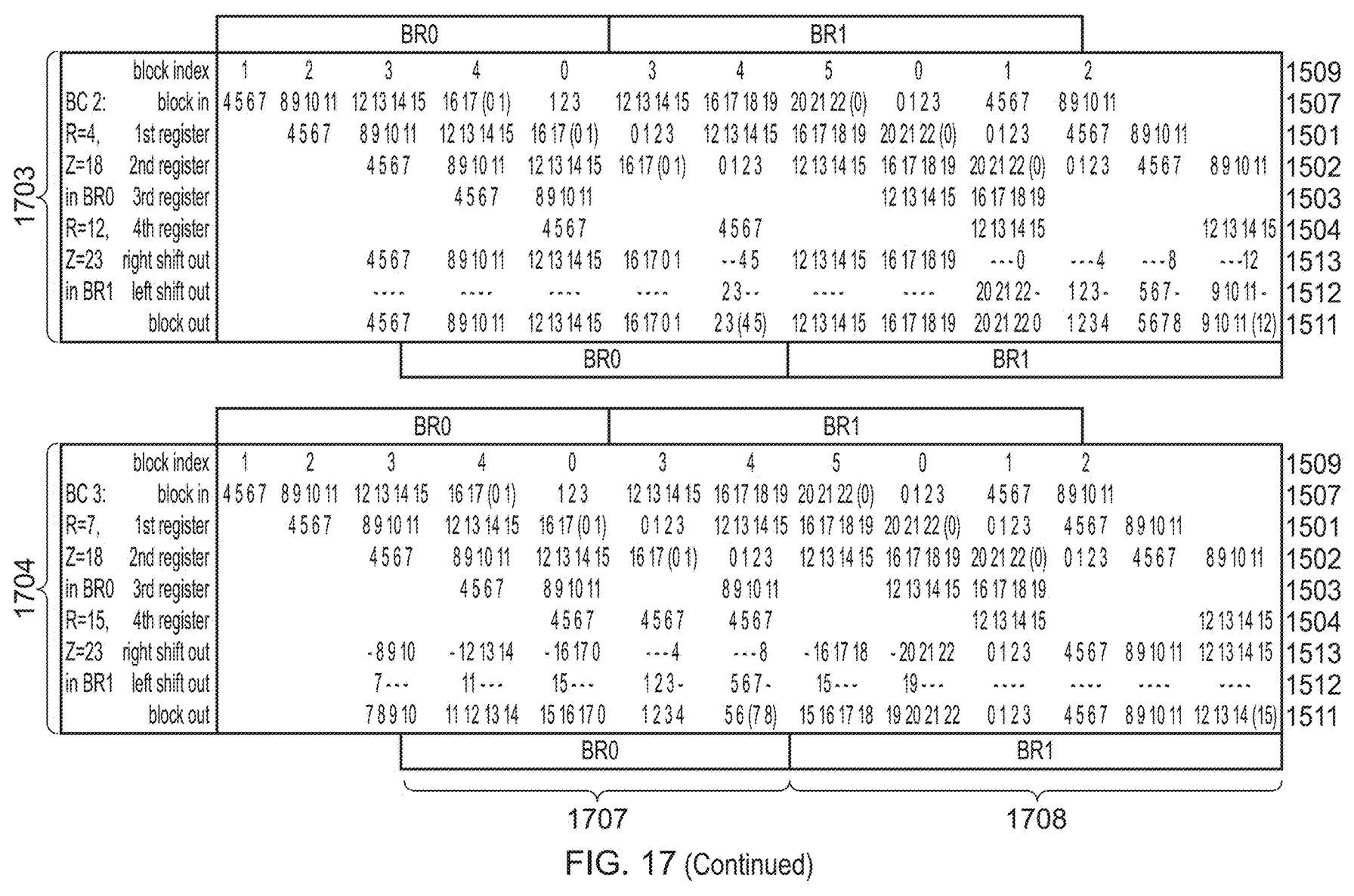

An operation-by-operation example 1700 of the pipelined processing of two block rows across four block columns 1701, 1702, 1703, 1704, using four replicas of the novel rotator circuit 1500 is shown in FIG. 17. This example considers the case where a parallelism of P=4 is adopted. The first block row comprises Z=18 values, while the second comprises Z=23. Note that a common value is adopted for Z across all block rows in a code block of the 3GPP LDPC code. However, the processing of block rows from two different code blocks having two different values of Z could be interleaved in a pipelined LDPC encoder or decoder architecture, as relevant to the example 1700 of FIG. 17. Different rotations R are applied for each block row in each block column, as is typical in the 3GPP LDPC code. The example 1700 of FIG. 17 spans a total of 13 operations, which may be indexed by the indices '0' to '12'. The inputting of the first block row 1705 occurs during the operations '0' to '4', while the inputting of the second block row 1706 occurs in a directly pipelined manner, in the operations '5' to '10'. The outputting of the first block row 1707 occurs with a pipeline delay of 2 operations, during the operations '2' to '6', while the outputting of the second block row 1708 occurs in a directly pipelined manner, in the operations '7' to '12'. For each operation, FIG. 17 shows the block index 1509, as well as the block of P input values obtained as the input block 1507, the output of each of the four registers 1501, 1502, 1503, 1504, the output of the left shifter 1512, the output of the right shifter 1513 and the output block 1511. In each case, it is the index of the value in the range 0 to Z−1 that is shown, rather than the value of the bit or LLR itself. Note that in the case of the left and right shifters 1512 and 1513, a dash is used to represent a zero-padded value that is shifted into the corresponding block of P shifting output values. Brackets are used to indicate padding values appended to the end of a series of Z data values, which are populated with values that are repeated from the start of the series of Z data values.

As illustrated in FIG. 17, the novel rotator circuit 1500 of FIG. 15 can typically select the inputs to the left and right shifters 1512 and 1513 from five blocks of P values available in a given operation, namely the input block from the current operation 1507, the input block from the previous operation, which is available in the registered values output by the first register 1501, the input block from two operations ago which is available in the registered values output by the third register 1502, the input block from the second operation which is available in the registered values output by the second register 1503 and the input block from the first operation which is available in the registered values output by the fourth register 1504. In the first operations of processing a block row, the input to the left shifter 1512 is typically taken from the output of the third register 1502 and the input to the right shifter 1513 is typically taken from the output of the first register 1501. Once the processing passes the padding values, the function switches and the input to the left shifter 1512 is typically taken from the output of the first register 1501, while the input to the right shifter 1513 is typically taken from the input block 1507. In the final one or two operations of the processing of a block row, the function switches again and the inputs to the left and right shifters 1512 and 1513 are taken from one or both of the outputs of the second and fourth registers 1503 and 1504.

As in the novel rotator circuits 1000 and 1300 of FIG. 10 and FIG. 13, it may be observed that even when R is not a multiple of P, some blocks of P input values provided at the input to the rotator 1507 may not require any shifting and may appear replicated directly in the output of the rotator 1511, albeit in a different position in the sequence of blocks. This can occur when mod(R,P) is equal to mod(Z,P), for example. In FIG. 17, this is illustrated in the case of the fourth block column 1704, during the second block row, when R=15 and Z=23. In this case, the output block 1511 comes directly from the output of the first register 1501 via the right shifter 1513, while the output from the left shifter 1512 does not contribute to the output block 1511 since it is all zero.

A skilled practitioner could recognise that given the circular nature of the data, the ordering of the blocks could be rotated before being input, and the function of the rotator would only have to consider the changes in the block index. This means that a scheme where the padding values are instead inserted into a block of P input values in the middle of the sequence of Z elements can be handled in the same way as discussed for this novel rotator. Similarly, a skilled practitioner could recognise that the padding values could be inserted at the start of a block of P input values, rather than at the end.

Note that when Z<P, a skilled practitioner would recognise that the novel rotator 1500 could be configured to take all Z data values as input, perform the required rotation and output all Z data values in the desired rotated order within a single operation.

In summary, the third improved rotator circuit of FIG. 15 performs a rotation function by a succession of operations on various sets of intermediate values, which include the input values 1507, the registered values output by the first, second, third and fourth registers 1501, 1502, 1503, 1504, the shifting input values output by the first and second multiplexers 1505, 1506, the shifting output values that are output by the first and second shifters 1512 and 1513, and finally the output values that are output by the combining circuit 1514. FIG. 15 provides a third example of how the registered values and shifting output values are derived from the input values.

Figure 18:
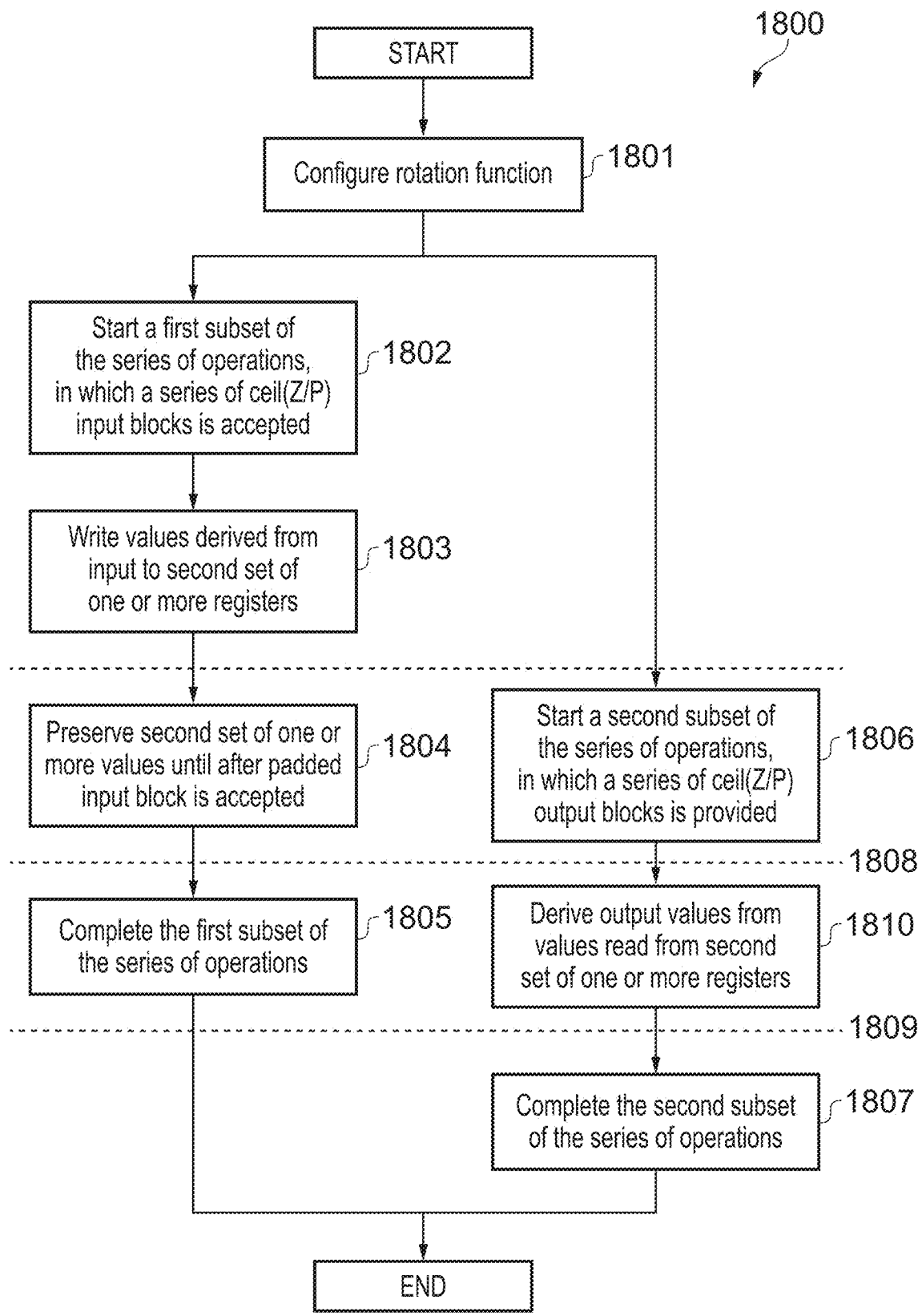
FIG. 18 illustrates a method for computation of LDPC rotation in an LDPC encoder or decoder, in accordance with some examples of the present invention.

Referring now to FIG. 18, a flowchart 1800 of a method for computation of low density parity check, LDPC, rotation in an LDPC encoder or decoder is illustrated, in accordance with some examples of the present invention. The LDPC encoder or decoder comprises a LDPC, rotator circuit having an input, an output, a first set of one or more registers operably coupled to a controller, a second set of one or more registers operably coupled to the controller and a parallelism, P, of at least two.

The method comprises configuring 1801 a rotation function by the LDPC rotator circuit comprising a series of operations that rotates a data sequence comprising a first number, Z, of data values by a second number, R, of positions, accepting a series of ceil(Z/P) input blocks, each comprising P number of input values, by the input during a first subset of the series of operations 1802, 1805, and providing by the output during a second subset of the series of operations 1806, 1807 a series of ceil(Z/P) output blocks, each comprising P number of output values, wherein the second subset of operations begins before the first subset of operations has completed 1808. The LDPC rotator circuit comprises, or is operably coupled to, the controller arranged to control the rotation function performed by the LDPC rotator circuit.

A number floor(Z/P) of the series of ceil(Z/P) input blocks comprise input values that are provided by a number P of the Z data values and one input block of the series of ceil(Z/P) input blocks is a padded input block that comprises input values that are provided by a number mod(Z,P) of the Z data values and a number P-mod(Z,P) of padding values when Z is not a multiple of P. The method further comprises: accepting one or more input values by the input before a second subset of the series of operations begins, deriving one or more registered values from the one or more input values, writing, under direction of the controller, the second set of one or more registers with the one or more derived registered values 1803, wherein the derived one or more registered values are not overwritten 1805 before 1809 the padded input block is accepted by the input, and at least one of the P output values in at least one of the output blocks is a function of at least one registered value in the second set of one or more registers 1810.

Application

Figure 19:
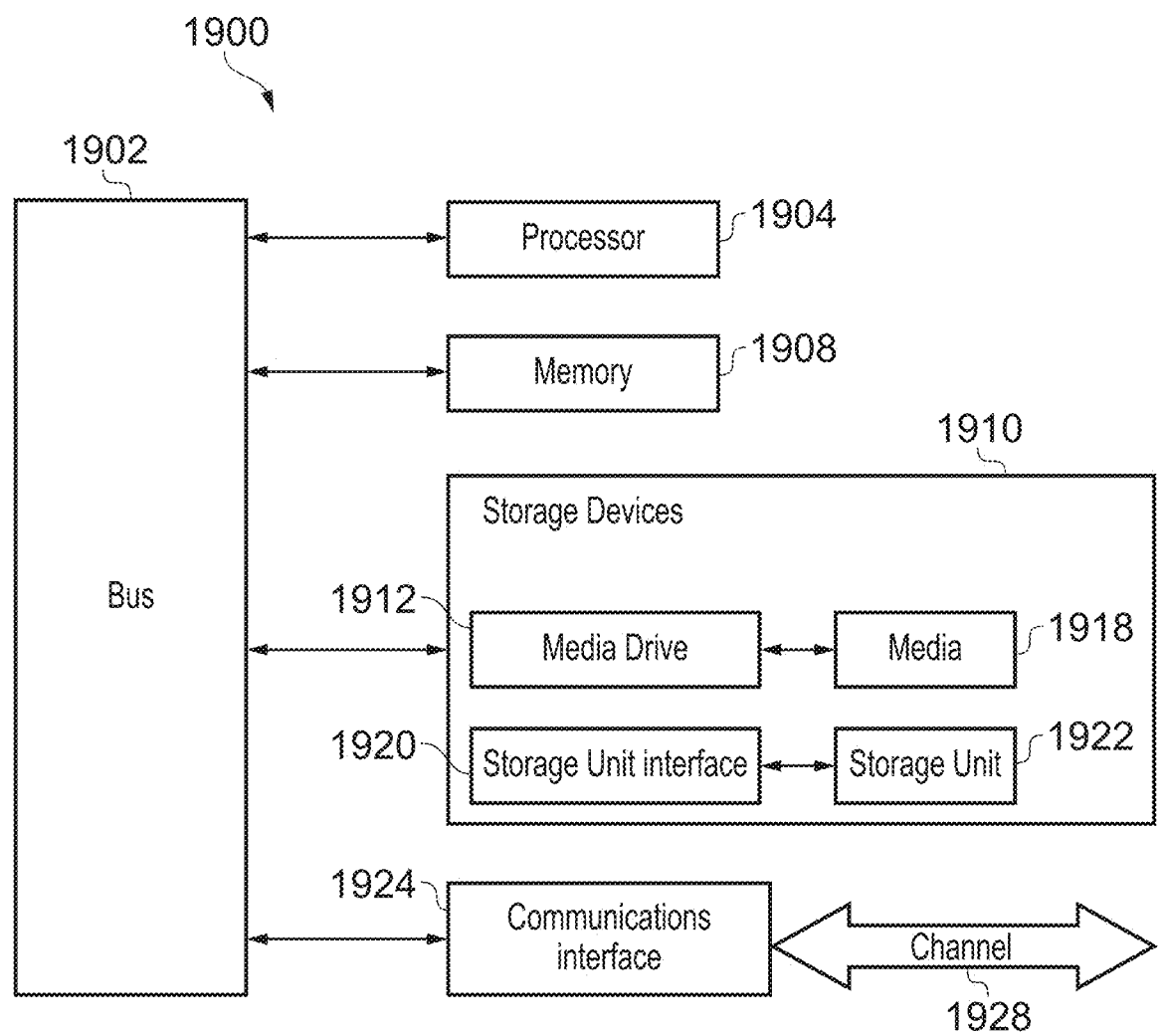
FIG. 19 illustrates one example of a software-based example architecture, in accordance with some examples of the present invention

Referring now to FIG. 19, there is illustrated a typical computing system 1900 that may be employed to implement LDPC computation according to some example embodiments of the invention. Computing systems of this type may be used in wireless communication devices. Those skilled in the relevant art will also recognize how to implement the invention using other computer systems or architectures. Computing system 1900 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 1900 can include at least one processors, such as a processor 1904. Processor 1904 can be implemented using a general or special-purpose processing engine such as, for example, a microprocessor, microcontroller or other control logic. In this example, processor 1904 is connected to a bus 1902 or other communications medium. In some examples, computing system 1900 may be a non-transitory tangible computer program product comprising executable code stored therein for implementing LDPC computation.

Computing system 1900 can also include a main memory 1908, such as random access memory (RAM) or other dynamic memory, for storing information and instructions to be executed by processor 1904. Main memory 1908 also may be used for storing temporary variables or other intermediate information during execution of instructions to be executed by processor 1904. Computing system 1900 may likewise include a read only memory (ROM) or other static storage device coupled to bus 1902 for storing static information and instructions for processor 1904.

The computing system 1900 may also include information storage system 1910, which may include, for example, a media drive 1912 and a removable storage interface 1920. The media drive 1912 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1918 may include, for example, a hard disk, floppy disk, magnetic tape, optical disk, CD or DVD, or other fixed or removable medium that is read by and written to by media drive 1912. As these examples illustrate, the storage media 1918 may include a computer-readable storage medium having particular computer software or data stored therein.

In alternative embodiments, information storage system 1910 may include other similar components for allowing computer programs or other instructions or data to be loaded into computing system 1900. Such components may include, for example, a removable storage unit 1922 and an interface 1920, such as a program cartridge and cartridge interface, a removable memory (for example, a flash memory or other removable memory module) and memory slot, and other removable storage units 1922 and interfaces 1920 that allow software and data to be transferred from the removable storage unit 1918 to computing system 1900.

Computing system 1900 can also include a communications interface 1924. Communications interface 1924 can be used to allow software and data to be transferred between computing system 1900 and external devices. Examples of communications interface 1924 can include a modem, a network interface (such as an Ethernet or other NIC card), a communications port (such as for example, a universal serial bus (USB) port), a PCMCIA slot and card, etc. Software and data transferred via communications interface 1924 are in the form of signals which can be electronic, electromagnetic, and optical or other signals capable of being received by communications interface 1924. These signals are provided to communications interface 1924 via a channel 1928. This channel 1928 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 1908, storage device 1918, or storage unit 1922. These and other forms of computer-readable media may store at least one instruction for use by processor 1904, to cause the processor to perform specified functions. Such instructions, generally referred to as 'computer program code' (which may be grouped in the form of computer programs or other groupings), when executed, enable the computing system 1900 to perform functions of embodiments of the present invention. Note that the code may directly cause the processor to perform specified functions, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1900 using, for example, removable storage drive 1922, drive 1912 or communications interface 1924. The control logic (in this example, software instructions or computer program code), when executed by the processor 1904, causes the processor 1904 to perform the functions of the invention as described herein.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described functions merely illustrative. The multiple functions may be combined into a single function, a single function may be distributed in additional functions and functions may be executed at least partially overlapping in time. Moreover, alternative embodiments may include multiple instances of a particular function, and the order of functions may be altered in various other embodiments.

The present invention is herein described with reference to an integrated circuit device comprising, say, a microprocessor configured to perform the functionality of a LDPC computation. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type. Also, the invention is not limited to physical devices or units implemented in non-programmable hardware but can also be applied in programmable devices or units able to perform the desired LDPC computation by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as at least one than one. Also, the use of introductory phrases such as 'at least one' and 'at least one' in the claims should not be construed to imply that the introduction of another claim element by the indefinite articles 'a' or 'an' limits any particular claim containing such introduced claim element to inventions containing only one such element, even when the same claim includes the introductory phrases 'at least one' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The word 'subset' refers to a selection of elements from a set, where that selection may comprise one, some or all of the elements in the set.

REFERENCES

[1] "3rd Generation Partnership Project; Technical Specification Group Radio Access Network; NR; Multiplexing and channel coding (Release 15)", 3GPP TS 38.212 V15.2.0, June 2018.
[2] [2] K. Shimizu, T. Ishikawa, N. Togawa, T. Ikenaga, and S. Goto, "Partially-parallel LDPC decoder based on high-efficiency message-passing algorithm," in *Proc. Int. Conf. Comput. Design*, October 2005, pp. 503-510.
[3] X. Wu, Y. Song, M. Jiang and C. Zhao, "Adaptive-Normalized/Offset Min-Sum Algorithm," in *IEEE Communications Letters*, vol. 14, no. 7, pp. 667-669, July 2010.

The invention claimed is:

1. A communication device comprising:
a low density parity check, LDPC, rotator circuit having an input and an output, wherein the LDPC rotator circuit is configured to have a parallelism, P, of at least two, and configured to perform a rotation function comprising a series of operations that rotates a data sequence comprising a first number, Z, of data values by a second number, R, of positions, wherein a series of ceil (Z/P) input blocks each comprising P number of input values is accepted by the input during a first subset of the series of operations, and wherein a series of ceil (Z/P) output blocks each comprising P number of output values are provided by the output during a second subset of the series of operations, wherein the second subset of operations begins before the first subset of operations has completed;
wherein the LDPC rotator circuit comprises, or is operably coupled to, a controller arranged to control the rotation function performed by the LDPC rotator circuit;
and wherein the LDPC rotator circuit comprises:
a first set of one or more registers that is written with one or more registered values that are derived from one or more input values that are accepted by the input during one or more of: previous operations, current operations;
a second set of one or more registers operably coupled to the controller;
at least one shifting circuit, operably coupled to the controller, configured to receive shifting input values that are derived from the P number of input values and apply a left shift and apply a right shift in order to provide shifting output values; and
at least one combining circuit that combines shifting output values originating from the at least one shifting circuit; and configured to provide the P number of output values to the output;
wherein a number floor (Z/P) of the series of ceil (Z/P) input blocks comprise input values that are provided by a number P of the Z data values and one input block of the series of ceil (Z/P) input blocks is a padded input block that comprises input values that are provided by a number mod (Z,P) of the Z data values and a number P-mod (Z,P) of padding values when Z is not a multiple of P; and
wherein the second set of one or more registers is written under direction of the controller with one or more registered values that are derived from one or more input values that are accepted by the input before a second subset of the series of operations begins and wherein the one or more registered values are not overwritten before the padded input block is accepted by the input, and at least one of the P output values in at least one of the output blocks-is a function of at least one registered value in the second set of one or more registers.

2. The communication device of claim 1, wherein the parallelism, P, is common to all rotation functions performed by the LDPC rotation circuit and the first number, Z, of data values and the second number, R, of positions vary between rotation functions.

3. The communication device of claim 1, wherein the series of operations comprises at least ceil (Z/P)+2 operations, wherein the first subset of the series of operations comprises at least ceil (Z/P) operations and the second subset of the series of operations comprises at least ceil (Z/P) operations.

4. The communication device of claim 1, wherein the first set of one or more registers is written with one or more registered values that are derived from one or more input values during at least one operation of the LDPC rotator circuit and at least one of the P output values in at least one of the output blocks is a function of at least one registered value in the first set of one or more registers.

5. The communication device of claim 1, wherein the padded input block is configured to adopt one of the following:
the P-mod (Z,P) padding values occupy a last P-mod (Z,P) positions in the padded input block and wherein the P-mod (Z,P) padding values are set to zero;
the P-mod (Z,P) padding values occupy a first P-mod (Z,P) positions in the padded input block and wherein the P-mod (Z,P) padding values are set to zero;
the P-mod (Z,P) padding values occupy a last P-mod (Z,P) positions in the padded input block and wherein the P-mod (Z,P) padding values are set equal to a first P-mod (Z,P) input values from an input block that immediately follows the padded input block in the series of ceil (Z/P) input blocks;
the P-mod (Z,P) padding values occupy a last P-mod (Z,P) positions in the padded input block and the padded input block is a last input block in the series of ceil (Z/P) input blocks and wherein the P-mod (Z,P) padding values are set equal to a first P-mod (Z,P) input values from a first input block in the series of ceil (Z/P) input blocks;
the P-mod (Z,P) padding values occupy a first P-mod (Z,P) positions in the padded input block and wherein the P-mod (Z,P) padding values are set equal to a last P-mod (Z,P) input values from an input block that immediately precedes the padded input block in the series of ceil (Z/P) input blocks;

the P-mod (Z,P) padding values occupy a first P-mod (Z,P) positions in the padded input block and the padded input block is a first input block in the series of ceil (Z/P) input blocks and wherein the P-mod (Z,P) padding values are set equal to a last P-mod (Z,P) input values from a last input block in the series of ceil (Z/P) input blocks.

6. The communication device of claim 1, wherein a first input block in the series of ceil (Z/P) input blocks contains a $(\mathrm{mod}(R,Z)+1)^{th}$ data value that is provided to the input of the LDPC rotator circuit during the first operation in the first subset of operations, and wherein each successive input block is provided to the input of the LDPC rotator circuit during each successive operation in the first subset of operations, with the input block containing a first data value in the data sequence being provided to the input of the LDPC rotator circuit during the operation in the first subset of operations that follows an operation when the input block containing a last data value in the data sequence is provided to the input of the LDPC rotator circuit.

7. The communication device of claim 1, wherein the at least one combining circuit comprises a bank of OR gates and wherein the left shift and right shift applied by the at least one shifting circuit use zero padding.

8. The communication device of claim 7, wherein the second set of one or more registers is further operably coupled to the at least one shifting circuit, and arranged to provide the at least one combining circuit with one or more shifting output value derived from one of the following:
the padded input block;
an input block that immediately follows the padded input block in the series of ceil (Z/P) input blocks;
a first input block in the series of ceil (Z/P) input blocks when the padded input block is a last input block in the series of ceil (Z/P) input blocks.

9. The communication device of claim 7, further comprising one or more masking circuit arranged to connect the second set of one or more registers and the at least one shifting circuit to the at least one combining circuit, wherein the one or more masking circuit is configured to determine whether the combining input values are derived from the shifting output values or whether they are derived from dummy values.

10. The communication device of claim 9, wherein the first set of one or more registers comprises one register, the second set of one or more registers comprises one register, the input values are provided as shifting input values to the at least one shifting circuit, and wherein the registered values of the first set of one or more registers and the second set of one or more registers are provided by shifting output values, and wherein the combining input values are provided by:
the registered values of the second set of one or more registers via the one or more masking circuits; and
the registered values of the first set of one or more registers; and
the shifting output values of the at least one shifting circuit.

11. The communication device of claim 1, wherein:
the first set of one or more registers comprises two registers,
wherein an input of a second register in the first set of one or more registers is operably coupled to an output of a first register in the first set of one or more registers to form a shift register;
wherein the second set of one or more registers comprises two registers, which are written with the input block in the series of ceil (Z/P) inputs blocks containing a $(\mathrm{mod}(R,Z)+1)^{th}$ data value, and written with either:
the input block in the series of ceil (Z/P) input blocks that immediately follows the input block in the series of ceil (Z/P) inputs blocks containing the $(\mathrm{mod}(R,Z)+1)^{th}$ data value; or
the first input block in the series of ceil (Z/P) input blocks when the input block in the series of ceil (Z/P) inputs blocks containing the $(\mathrm{mod}(R,Z)+1)^{th}$ data value is the last input block in the series of ceil (Z/P) input blocks; and
wherein the second set of one or more registers is configured to be not overwritten before the second subset of operations ends.

12. The communication device of claim 11, further comprising at least one multiplexing circuit configured to multiplex the registered values of the first and second sets of registers and provide the shifting input values for the at least one shifting circuit.

13. The communication device of claim 11, wherein the rotation function performed by the LDPC rotator circuit comprises a first rotation function pipelined with a second rotation function, wherein a first operation in the first subset of operations of the second rotation function precedes a last operation in the second subset of operations of the first rotation function, and wherein a first operation in the second subset of operations of the second rotation function immediately follows a last operation in the second subset of operations of the first rotation function.

14. The communication device of claim 1, when performing a rotation function in which Z is less than P, the rotation function is performed in a single operation.

15. The communication device of claim 1, when performing a rotation function in which Z is a multiple of P, the series of operations comprises at least ceil (Z/P)+1 operations.

16. The communication device of claim 1, wherein the at least one combining circuit further combines the shifting output values with outputs originating from at least one of: the controller, the first set of one or more registers, the second set of one or more registers.

17. A method for computation of LDPC rotation in an LDPC encoder or decoder comprising a low density parity check, LDPC, rotator circuit having an input, an output, a first set of one or more registers that is written with one or more registered values that are derived from one or more input values that are accepted by the input during one or more of: previous operations, current operations, a second set of one or more registers operably coupled to a controller and a parallelism, P, of at least two, the method comprising:
configuring a rotation function by the LDPC rotator circuit comprising a series of operations that rotates a data sequence comprising a first number, Z, of data values by a second number, R, of positions,
accepting a series of ceil (Z/P) input blocks, each comprising P number of input values, by the input during a first subset of the series of operations,
receiving shifting input values that are derived from the P number of input values and applying a left shift and applying a right shift by at least one shifting circuit in order to provide shifting output values;
providing by the output during a second subset of the series of operations a series of ceil (Z/P) output blocks, each comprising P number of output values output by at least one combining circuit that combines outputs originating the shifting output values; and
providing the P number of output values to an output;

wherein the second subset of operations begins before the first subset of operations has completed; wherein the LDPC rotator circuit comprises, or is operably coupled to, the controller arranged to control the rotation function performed by the LDPC rotator circuit, wherein a number floor (Z/P) of the series of ceil (Z/P) input blocks comprise input values that are provided by a number P of the Z data values and one input block of the series of ceil (Z/P) input blocks is a padded input block that comprises input values that are provided by a number mod (Z,P) of the Z data values and a number P-mod (Z,P) of padding values when Z is not a multiple of P; and the method further comprising:

accepting one or more input values by the input before a second subset of the series of operations begins, deriving one or more registered values from the one or more input values, writing, under direction of the controller, the second set of one or more registers with the one or more derived registered values, wherein the derived one or more registered values are not overwritten before the padded input block is accepted by the input, and at least one of the P output values in at least one of the output blocks is a function of at least one registered value in the second set of one or more registers.

18. The method for computation of LDPC rotation in an LDPC encoder or decoder of claim 17, wherein the parallelism, P, is common to all rotation functions performed by the LDPC rotation circuit and the first number, Z, of data values and the second number, R, of positions vary between rotation functions.

19. The method for computation of LDPC rotation in an LDPC encoder or decoder of claim 17, wherein the series of operations comprises at least ceil (Z/P)+2 operations, wherein the first subset of the series of operations comprises at least ceil (Z/P) operations and the second subset of the series of operations comprises at least ceil (Z/P) operations.

20. The method for computation of LDPC rotation in an LDPC encoder or decoder of claim 17, wherein the first set of one or more registers is written with one or more registered values that are derived from one or more input values during at least one operation of the LDPC rotator circuit and at least one of the P output values in at least one of the output blocks is a function of at least one registered value in the first set of one or more registers.

* * * * *